(12) United States Patent
Ching et al.

(10) Patent No.: US 10,269,933 B2
(45) Date of Patent: Apr. 23, 2019

(54) RECESSING STI TO INCREASE FIN HEIGHT IN FIN-FIRST PROCESS

(71) Applicant: Taiwan Semiconductor Manufacturing Company, Ltd., Hsin-Chu (TW)

(72) Inventors: Kuo-Cheng Ching, Zhubei (TW); Guan-Lin Chen, Baoshan Township (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 62 days.

(21) Appl. No.: 15/253,977

(22) Filed: Sep. 1, 2016

(65) Prior Publication Data
US 2016/0372580 A1    Dec. 22, 2016

Related U.S. Application Data

(60) Division of application No. 14/325,768, filed on Jul. 8, 2014, now Pat. No. 9,443,962, which is a
(Continued)

(51) Int. Cl.
*H01L 29/06* (2006.01)
*H01L 29/66* (2006.01)
(Continued)

(52) U.S. Cl.
CPC .. *H01L 29/66795* (2013.01); *H01L 21/76224* (2013.01); *H01L 29/0657* (2013.01);
(Continued)

(58) Field of Classification Search
None
See application file for complete search history.

(56) References Cited

U.S. PATENT DOCUMENTS 6,720,619 B1    4/2004  Chen et al.
6,936,516 B1    8/2005  Goo et al.
(Continued)

FOREIGN PATENT DOCUMENTS

CN          1992255 A      7/2007
CN        101677085 A      3/2010
KR     1020110098594 A     9/2011

*Primary Examiner* — Nishath Yasmeen
(74) *Attorney, Agent, or Firm* — Slater Matsil, LLP

(57) ABSTRACT

A method includes forming a gate stack over top surfaces of a semiconductor strip and insulation regions on opposite sides of the semiconductor strip. The insulation regions include first portions overlapped by the gate stack, and second portions misaligned from the gate stack. An end portion of the semiconductor strip is etched to form a recess, wherein the recess is located between the second portions of the insulation regions. An epitaxy is performed to grow a source/drain region from the recess. After the epitaxy, a recessing is performed to recess the second portions of the insulation regions, with the second portions of the insulation regions having first top surfaces after the first recessing. After the recessing, a dielectric mask layer is formed on the first top surfaces of the second portions of the insulation regions, wherein the dielectric mask layer further extends on a sidewall of the gate stack.

20 Claims, 28 Drawing Sheets

Related U.S. Application Data continuation-in-part of application No. 13/673,717, filed on Nov. 9, 2012, now Pat. No. 9,281,378.

(51) Int. Cl.
*H01L 29/78* (2006.01)
*H01L 21/762* (2006.01)

(52) U.S. Cl.
CPC ...... *H01L 29/66545* (2013.01); *H01L 29/785* (2013.01); *H01L 29/7851* (2013.01)

(56) References Cited

U.S. PATENT DOCUMENTS

| | | |
|---|---|---|
| 7,172,943 B2 | 2/2007 | Yeo et al. |
| 7,211,864 B2 | 5/2007 | Seliskar |
| 7,544,994 B2 | 6/2009 | Schepis et al. |
| 7,612,405 B2 | 11/2009 | Yu |
| 7,622,773 B2 | 11/2009 | Irisawa et al. |
| 7,651,893 B2 | 1/2010 | Chen et al. |
| 7,714,384 B2 | 5/2010 | Seliskar |
| 7,728,324 B2 | 6/2010 | Tezuka et al. |
| 7,812,370 B2 | 10/2010 | Bhuwalka et al. |
| 7,863,674 B2 | 1/2011 | Yeo et al. |
| 7,879,675 B2 | 2/2011 | Radosavljevic et al. |
| 7,915,112 B2 | 3/2011 | Xu et al. |
| 7,972,914 B2 | 7/2011 | Kim et al. |
| 8,053,299 B2 | 11/2011 | Xu |
| 8,466,034 B2 | 6/2013 | Maszara et al. |
| 8,466,511 B2 | 6/2013 | Oh |
| RE44,431 E | 8/2013 | Pendse |
| 8,735,232 B2 | 5/2014 | Baars et al. |
| 2002/0003256 A1 | 1/2002 | Maegawa |
| 2002/0037619 A1 | 3/2002 | Sugihara et al. |
| 2002/0072197 A1 | 6/2002 | Kang et al. |
| 2005/0056888 A1 | 3/2005 | Youn et al. |
| 2005/0145932 A1 | 7/2005 | Park et al. |
| 2005/0156171 A1 | 7/2005 | Brask et al. |
| 2005/0224800 A1 | 10/2005 | Lindert et al. |
| 2005/0263795 A1 | 12/2005 | Choi et al. |
| 2007/0020879 A1 | 1/2007 | Baek et al. |
| 2007/0045736 A1 | 3/2007 | Yagishita |
| 2007/0063263 A1 | 3/2007 | Oh et al. |
| 2007/0102763 A1 | 5/2007 | Yeo et al. |
| 2007/0134884 A1 | 6/2007 | Kim et al. |
| 2007/0210355 A1 | 9/2007 | Izumida |
| 2007/0235819 A1 | 10/2007 | Yagishita |
| 2008/0157172 A1 | 7/2008 | Lee |
| 2008/0299734 A1 | 12/2008 | Lee et al. |
| 2009/0095980 A1* | 4/2009 | Yu ..................... H01L 29/66795 257/190 |
| 2009/0230483 A1 | 9/2009 | Mizumura et al. |
| 2009/0267155 A1 | 10/2009 | Izumida et al. |
| 2009/0315112 A1 | 12/2009 | Lee |
| 2010/0044784 A1 | 2/2010 | Oh et al. |
| 2010/0052059 A1 | 3/2010 | Lee |
| 2010/0133614 A1 | 6/2010 | Beyer et al. |
| 2010/0163970 A1 | 7/2010 | Rakshit et al. |
| 2010/0207208 A1 | 8/2010 | Bedell et al. |
| 2010/0301391 A1 | 12/2010 | Lochtefeld |
| 2011/0031552 A1 | 2/2011 | Iwamatsu et al. |
| 2011/0095378 A1 | 4/2011 | Lee et al. |
| 2011/0108930 A1 | 5/2011 | Cheng et al. |
| 2011/0147811 A1 | 6/2011 | Kavalieros et al. |
| 2011/0147828 A1 | 6/2011 | Murthy et al. |
| 2011/0147842 A1 | 6/2011 | Cappellani et al. |
| 2011/0171795 A1 | 7/2011 | Tsai et al. |
| 2011/0193178 A1 | 8/2011 | Chang et al. |
| 2011/0210404 A1 | 9/2011 | Su et al. |
| 2011/0215375 A1 | 9/2011 | Cook, Jr. et al. |
| 2011/0223736 A1 | 9/2011 | Lin et al. |
| 2011/0237046 A1 | 9/2011 | Maszara et al. |
| 2011/0291196 A1 | 12/2011 | Wei et al. |
| 2011/0316080 A1 | 12/2011 | Luo et al. |
| 2012/0001266 A1 | 1/2012 | Lim et al. |
| 2012/0074464 A1 | 3/2012 | Cea et al. |
| 2012/0091528 A1 | 4/2012 | Chang et al. |
| 2012/0091538 A1 | 4/2012 | Lin et al. |
| 2012/0104472 A1 | 5/2012 | Xu et al. |
| 2012/0161238 A1 | 6/2012 | Scheiper et al. |
| 2012/0168817 A1 | 7/2012 | Abou-Khalil et al. |
| 2012/0211807 A1 | 8/2012 | Yu et al. |
| 2012/0261726 A1 | 10/2012 | Yang et al. |
| 2012/0299100 A1 | 11/2012 | Ota et al. |
| 2012/0319211 A1 | 12/2012 | van Dal et al. |
| 2013/0049140 A1 | 2/2013 | Asenov et al. |
| 2013/0099282 A1 | 4/2013 | Chen et al. |
| 2013/0134506 A1 | 5/2013 | Yagishita |
| 2013/0175584 A1 | 7/2013 | Ho et al. |
| 2013/0181264 A1 | 7/2013 | Liao et al. |
| 2013/0187206 A1 | 7/2013 | Mor et al. |
| 2013/0200455 A1 | 8/2013 | Lo et al. |
| 2013/0200459 A1 | 8/2013 | Adam et al. |
| 2013/0200468 A1 | 8/2013 | Cai et al. |
| 2013/0270628 A1 | 10/2013 | Huang et al. |
| 2013/0285141 A1 | 10/2013 | Kuo et al. |

* cited by examiner

US 10,269,933 B2

RECESSING STI TO INCREASE FIN HEIGHT IN FIN-FIRST PROCESS

PRIORITY CLAIM AND CROSS-REFERENCE

This application is a divisional of U.S. patent application Ser. No. 14/325,768, entitled "Recessing STI to Increase FIN Height in FIN-First Process," filed on Jul. 8, 2014, which application is a continuation-in-part application of the following commonly-assigned U.S. patent application Ser. No. 13/673,717, filed Nov. 9, 2012, now U.S. Pat. No. 9,281,378, issued Mar. 8, 2016 and entitled "Fin Recess Last Process for FinFET Fabrication;" which applications are hereby incorporated herein by reference.

BACKGROUND

With the increasing down-scaling of integrated circuits and increasingly demanding requirements to the speed of integrated circuits, transistors need to have higher drive currents with smaller dimensions. Fin Field-Effect Transistors (FinFETs) were thus developed. FinFETs have increased channel widths. The increase in the channel widths is achieved by forming channels that include portions on the sidewalls of semiconductor fins and portions on the top surfaces of the semiconductor fins. Since the drive currents of transistors are proportional to the channel widths, the drive currents of the FinFETs are increased.

In an existing FinFET formation process, Shallow Trench Isolation (STI) regions are first formed in a silicon substrate. The STI regions are then recessed to form silicon fins, which comprise portions of the silicon substrate that are over the recessed STI regions. Next, a gate dielectric, a gate electrode, and source and drain regions are formed to finish the formation of the FinFET.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
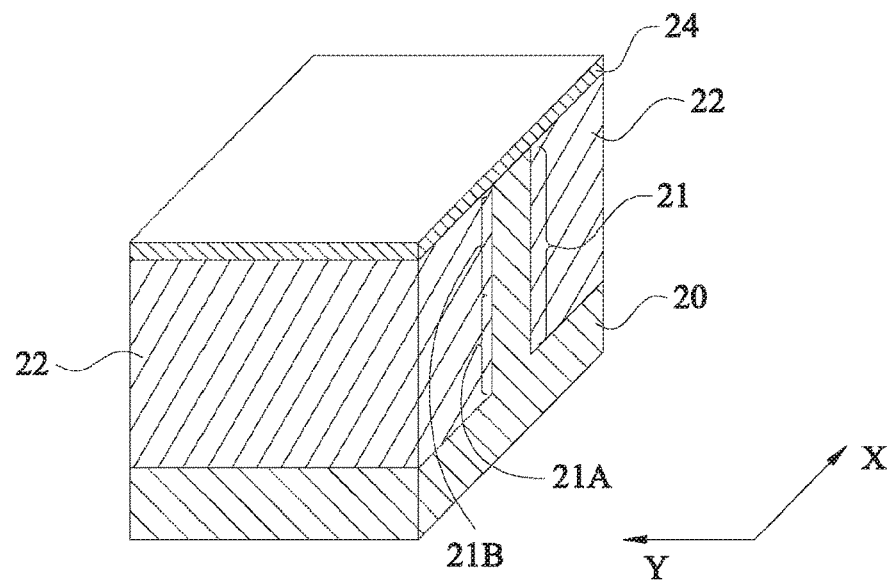
FIGS. 1 through 9D are perspective views and cross-sectional views of intermediate stages in the manufacturing of a FinFET in accordance with various exemplary embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A Fin Field-Effect Transistor (FinFET) and the methods of forming the same are provided in accordance with various embodiments. The intermediate stages of forming the FinFET are illustrated. The variations of the embodiments are discussed. Throughout the various views and illustrative embodiments, like reference numbers are used to designate like elements.

FIGS. 1 through 9D are cross-sectional views and perspective views of intermediate stages in the manufacturing of a FinFET in accordance with some exemplary embodiments. FIG. 1 illustrates a perspective view of an initial structure. The initial structure includes substrate 20. Substrate 20 may be a semiconductor substrate, which may further be a silicon substrate, a germanium substrate, or a substrate formed of other semiconductor materials. Substrate 20 may be doped with a p-type or an n-type impurity. Isolation regions such as Shallow Trench Isolation (STI) regions 22 are formed in substrate 20 and extend from a top surface of substrate 20 into substrate 20.

Figure 3:
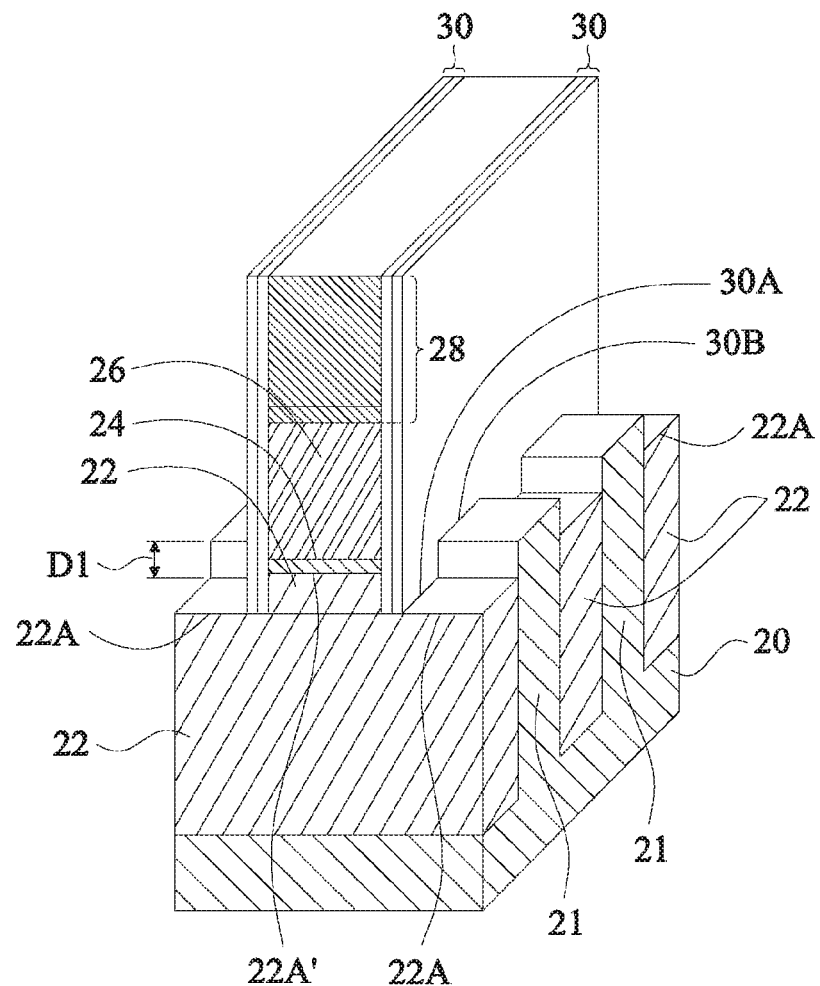

As shown in FIG. 1, semiconductor strip 21 is formed between, and contacting, neighboring STI regions 22. The longitudinal direction of semiconductor strip 21 is in the Y direction. Although one semiconductor strip 21 is shown in FIG. 1 for clarity, there may be a plurality of semiconductor strip 21 parallel to each other, as also illustrated in FIG. 3. In some exemplary embodiments, the material of semiconductor strip 21 is the same as the material of substrate 20, which may be silicon, for example. In alternative embodiments, the material of semiconductor strip 21 is different from the material of substrate 20. In some exemplary embodiments, the FinFET that is to be formed is a p-type FinFET, and semiconductor strip 21 includes relaxed silicon germanium (SiGe) region 21A and substantially pure germanium region 21B over relaxed SiGe region 21A. In alternative exemplary embodiments, the FinFET that is to be formed is an n-type MOSFET, and semiconductor strip 21 includes relaxed silicon germanium (SiGe) region 21A and substantially pure silicon region 21B over relaxed SiGe region 21A. In these embodiments, semiconductor strip 21 may be formed by etching a portion of the original substrate 20 between STI regions 22, and epitaxially growing semiconductor strip 21 between STI regions 22.

Hard mask layer 24 is formed over semiconductor strip 21 and STI regions 22. Hard mask layer 24 may be in contact with the top surfaces of STI regions 22 and semiconductor strip 21. In some embodiments, hard mask layer 24 comprises silicon nitride. In alternative embodiments, materials such as silicon oxide, silicon carbide, metal nitrides such as titanium nitride and tantalum nitride, or the like, may also be used.

Figure 2:
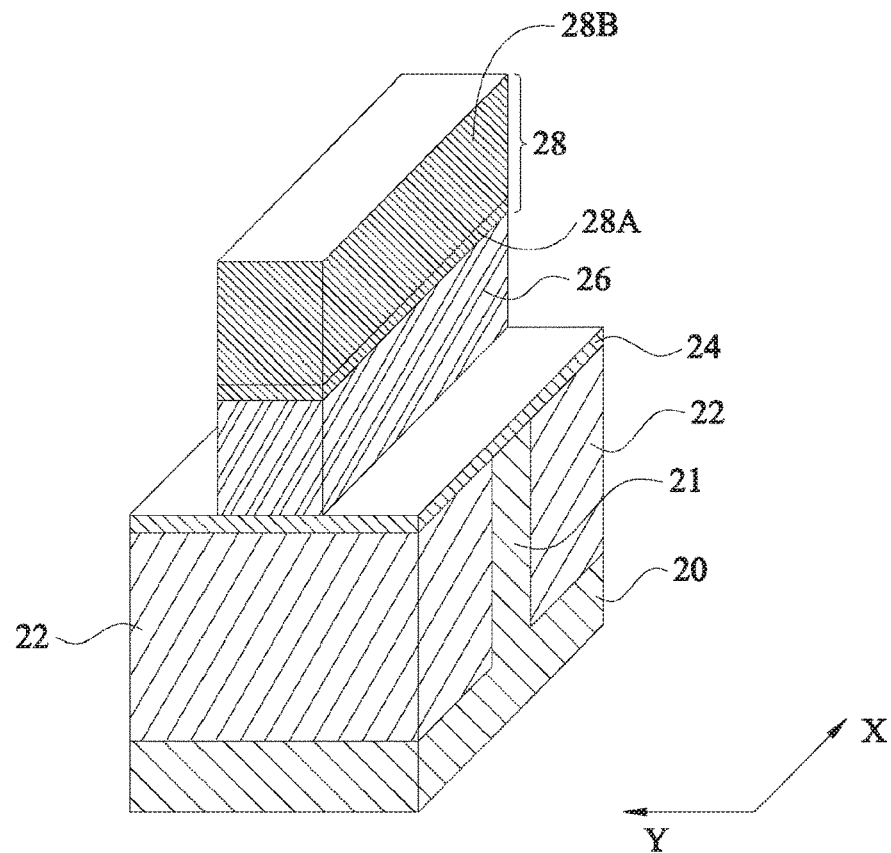

Referring to FIG. 2, polysilicon layer 26 is deposited. In accordance with some embodiments, a planarization step such as a grinding or a Chemical Mechanical Polish (CMP) is performed to level the top surface of polysilicon layer 26. Hard mask layer 28 is then formed over polysilicon layer 26. Hard mask layer 28 may be formed of silicon nitride, for example, although other materials such as silicon oxide may also be used. In some exemplary embodiments, as shown in FIG. 2, hard mask layer 28 includes silicon nitride layer 28A and oxide layer 28B over silicon nitride layer 28A.

As also shown in FIG. 2, hard mask layer 28 is patterned. To pattern hard mask layer 28, a photo resist (not shown) may be formed and patterned first, and the patterned photo resist is used as an etching mask to pattern hard mask layer 28. The patterned photo resist is then removed. A remaining portion of hard mask layer 28 is referred to as hard mask strip 28 hereinafter. Next, hard mask strip 28 is used as an etching mask to etch the underlying polysilicon layer 26, wherein the patterning may be stopped on hard mask layer 24. A remaining portion of polysilicon layer 26 is referred to as polysilicon strip 26 hereinafter. Polysilicon strip 26 overlaps a middle portion of semiconductor strip 21, and having a longitudinal direction in X direction, which is perpendicular to the Y direction.

Figure 6:
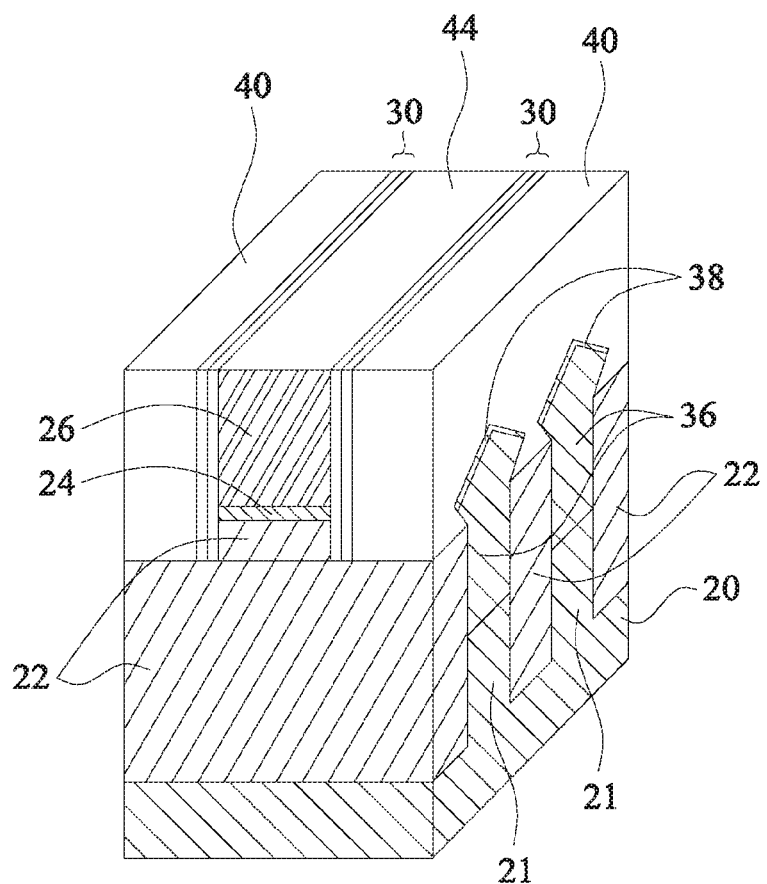

Referring to FIG. 3, hard mask strip 28 is used as an etching mask to selectively pattern hard mask layer 24. In FIG. 3, two semiconductor strip 21 are illustrated. Some portions of STI regions 22 and semiconductor strip 21 are exposed as a result of the patterning of hard mask layer 24. A first STI recessing may be performed after the patterning of hard mask layer 24. As a result of the STI recessing, top surfaces 22A of STI regions 22 are also recessed from the original top surface 22A' of STI regions. In some embodiments, the exposed portions of semiconductor strip 21 that are not covered by hard mask strip 28 are not recessed. In some embodiments, after the patterning of hard mask layer 24, and before or after the recessing of STI regions 22, hard mask strip 28 is removed. In alternative embodiments, hard mask strip 28 may be removed after some subsequent steps are performed. For example, hard mask strip 28 may be performed after the formation of Inter-Layer Dielectric (ILD) 40 (FIG. 6).

Next, as also shown in FIG. 3, gate spacers 30 are formed on the sidewalls of hard mask strip 28, polysilicon strip 26, and the sidewalls of some un-recessed portions of STI regions 22. Gate spacers 30 are formed of dielectric materials. Gate spacers 30 comprise first bottom surfaces landing on the top surfaces 22A of STI regions 22, and second bottom surfaces landing on the top surfaces of semiconductor strip 21. Since top surfaces 22A of the recessed STI regions 22 are lower than the top surfaces of semiconductor strip 21, the first bottom surfaces are lower than the second bottom surfaces.

Figure 4:
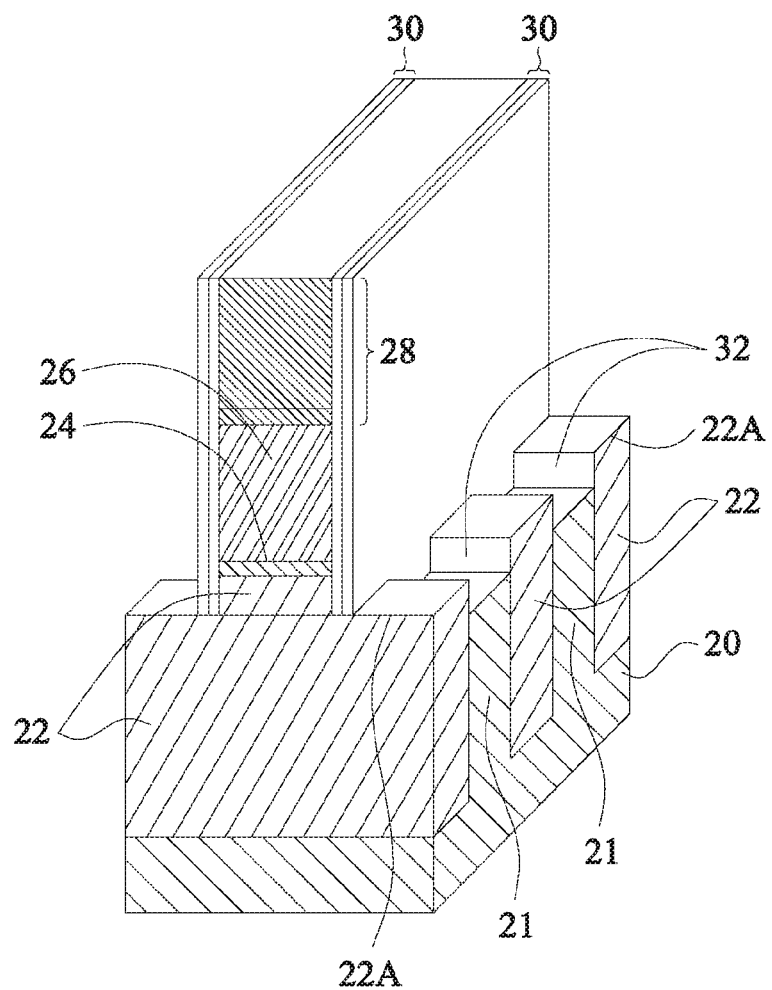

Referring to FIG. 4, after the formation of gate spacers 30, exposed portions of semiconductor strip 21 are recessed, for example, using anisotropic etching. In some embodiments, portions of semiconductor strip 21 above the exposed top surface 22A of STI regions 22 are etched. The etching of semiconductor strip 21 may be continued until the top surfaces of semiconductor strip 21 are lower the top surfaces 22A of STI regions 22, forming recesses 32 in STI regions 22. Recesses 32 include portions that on opposite sides of polysilicon strip 26.

Figure 5:
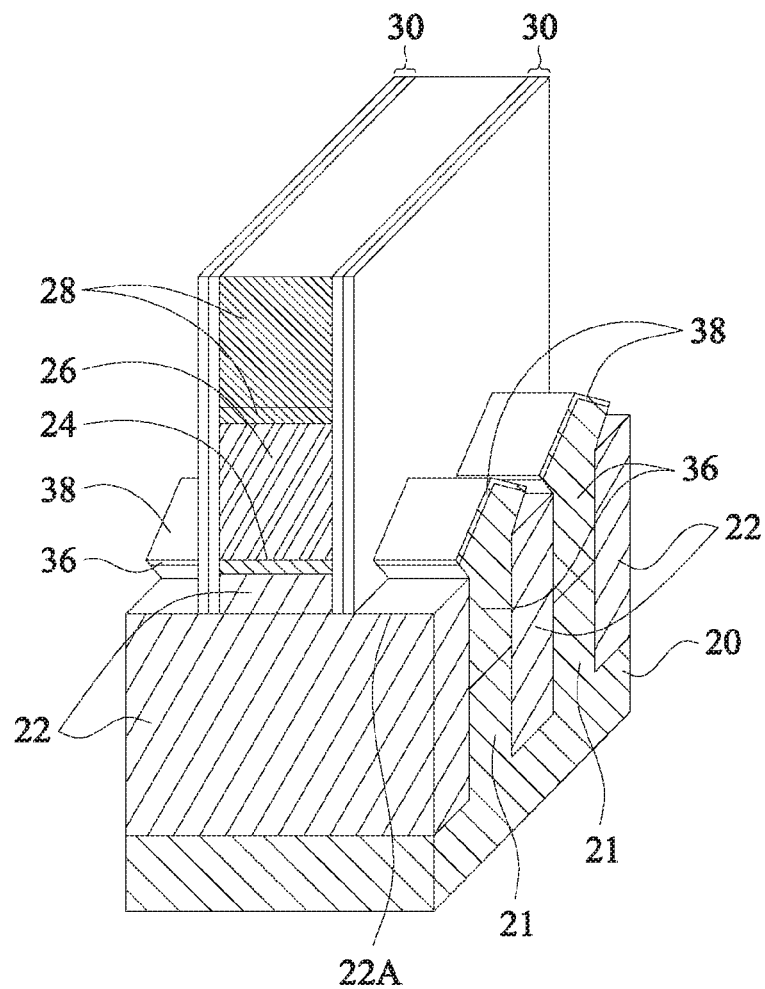

Next, as shown in FIG. 5, epitaxy regions 36 are formed by selectively growing epitaxy regions 36 from recesses 32 (FIG. 4). In some exemplary embodiments, epitaxy regions 36 comprise silicon germanium or silicon carbon. Alternatively, epitaxy regions 36 are formed of silicon. After recesses 32 are filled with epitaxy regions 36, the further epitaxial growth of epitaxy regions 36 causes epitaxy regions 36 to expand horizontally, and facets start to form. Furthermore, some of top surfaces 22A of STI regions 22 are underlying some portions of epitaxy regions 36 due to the horizontal growth of epitaxy regions 36. After the epitaxy step, epitaxy regions 36 may be implanted to form source and drain regions, which are also denoted using reference numeral 36. Source and drain regions 36 are on opposite sides of polysilicon strip 26, and may be overlying and overlapping portions of surfaces 22A of STI regions 22. Following the formation of source and drain regions 36, source and drain silicide regions 38 may be formed by siliciding the top portions of epitaxy regions 36. In alternative embodiments, source and drain silicide regions 38 are formed after the formation of replacement gate electrode 52 (FIGS. 9A-9D).

FIG. 6 illustrates the formation of Inter-Layer Dielectric (ILD) 40. In some embodiments, ILD 40 includes carbon-containing oxides, silicate glass, or other dielectric materials. ILD 40 may be filled until its top surface is higher than the top surface of polysilicon strip 26, or higher than hard mask strip 28 (note shown in FIG. 6, please refer to FIGS. 3 and 4). A CMP is then performed to remove excess ILD 40. In some embodiments, polysilicon strip 26 is used as a CMP stop layer, so that the top surfaces of ILD 40 is level with the top surfaces of polysilicon strips 26. In alternative embodiments, hard mask strip 28 (FIG. 3) may also be used as a CMP stop layer. In the embodiments wherein hard mask strip 28 is used as the CMP stop layer, after the CMP, an etching step may be performed to remove hard mask strip 28.

Figure 7:
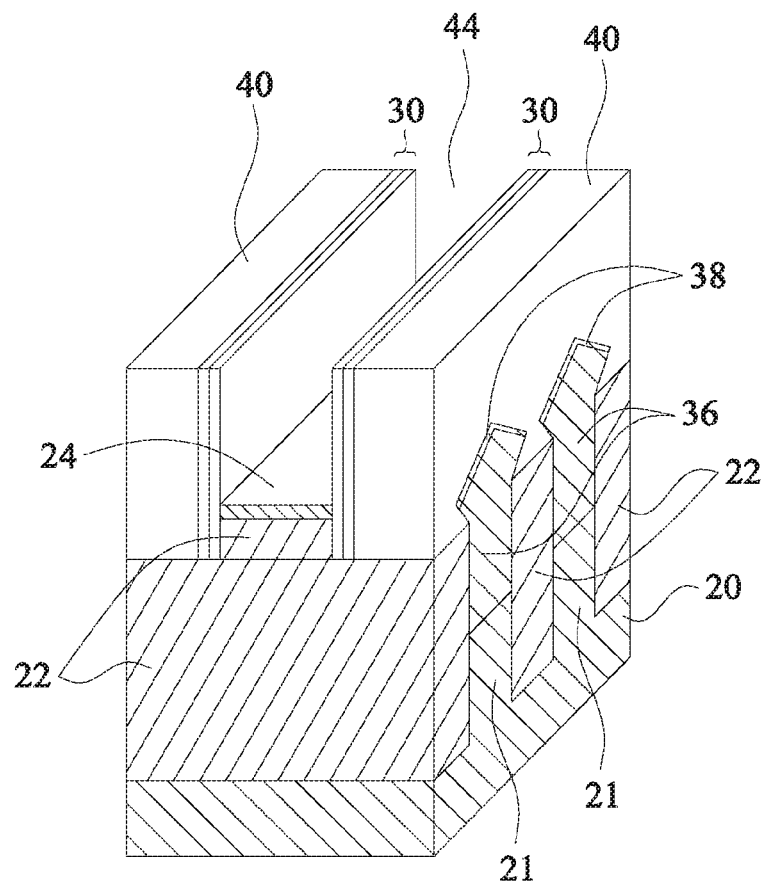

Next, referring to FIG. 7, polysilicon strip 26 is removed in an etching step, so that recess 44 is formed between opposite gate spacers 30. Hard mask layer 24 is thus exposed. Since polysilicon strip 26 is not in the final structure, polysilicon strip 26 is referred to as a dummy polysilicon strip throughout the description.

Figure 8A:
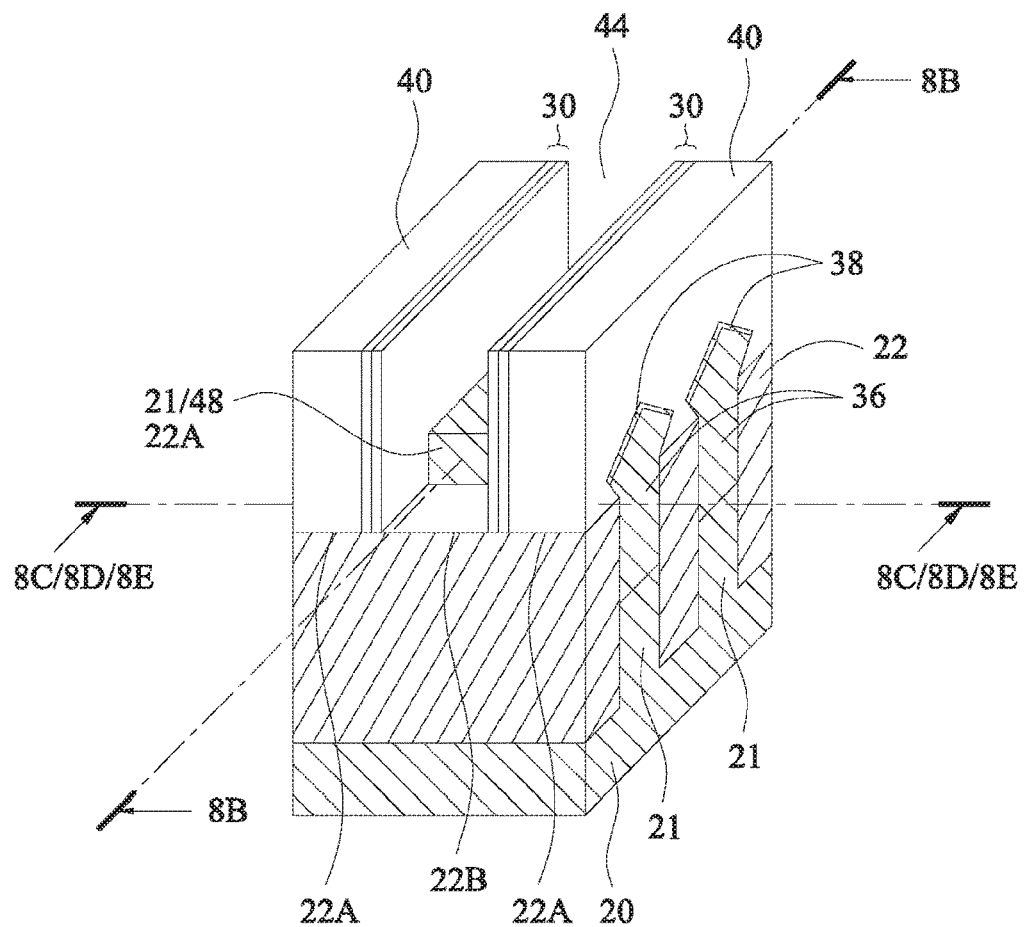

After the removal of dummy polysilicon strip 26, hard mask layer 24 is removed. The resulting structure is shown in FIG. 8A. After the removal of hard mask layer 24, the portions of STI regions 22 underlying the removed hard mask layer 24 are recessed in a second recessing step, which may be a selective etching step, so that recess 44 extends downwardly. The top surfaces the recessed STI regions 22 are also recessed from the original surfaces 22A' (FIG. 3) to top surfaces 22B. As a result, STI regions 22 have top surfaces 22B generated by the etching step. During the selective etching, semiconductor strip 21 are not etched, and the portions of semiconductor strip 21 over top surface 22B form semiconductor fins 48.

Figure 8B:
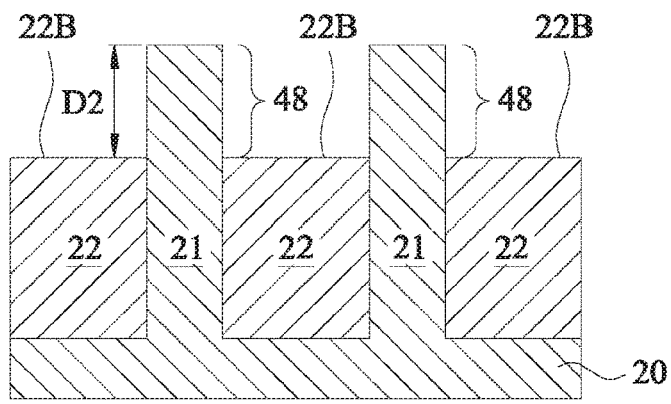

FIG. 8B illustrates a cross-sectional view of the structure in FIG. 8A, wherein the cross-sectional view is obtained from the plane crossing line 8B-8B in FIG. 8A. Semiconductor fins 48 are illustrated in FIG. 8B.

Figure 8C:
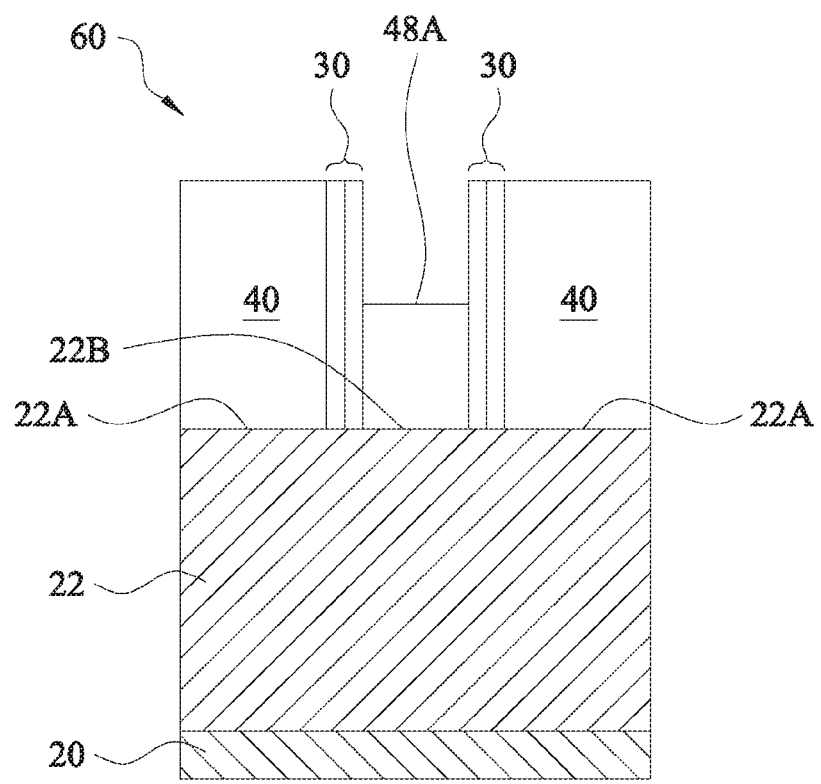
Figure 8D:
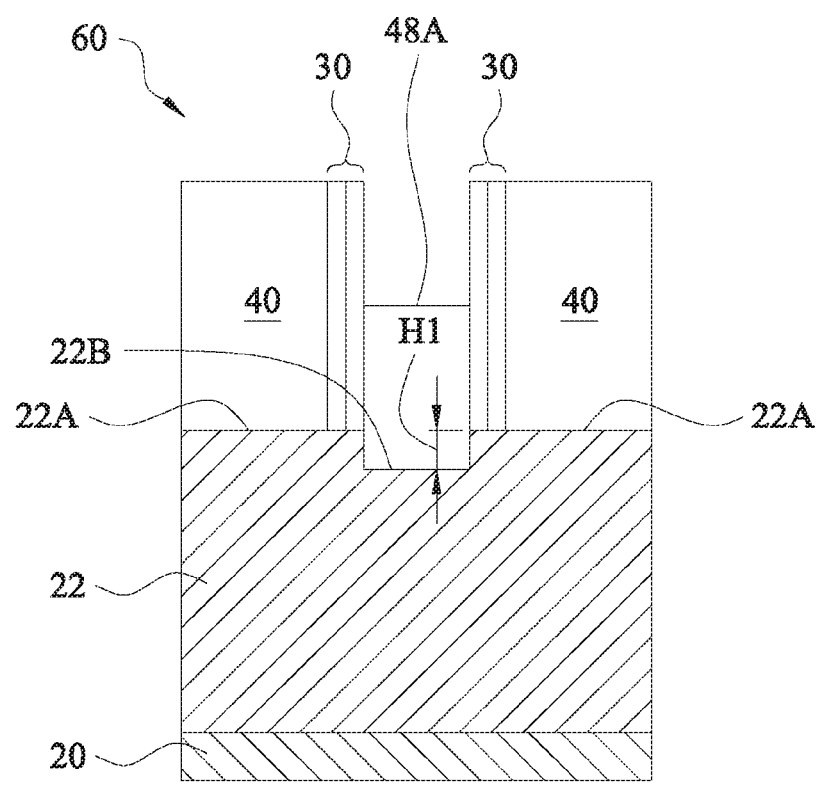
Figure 8E:
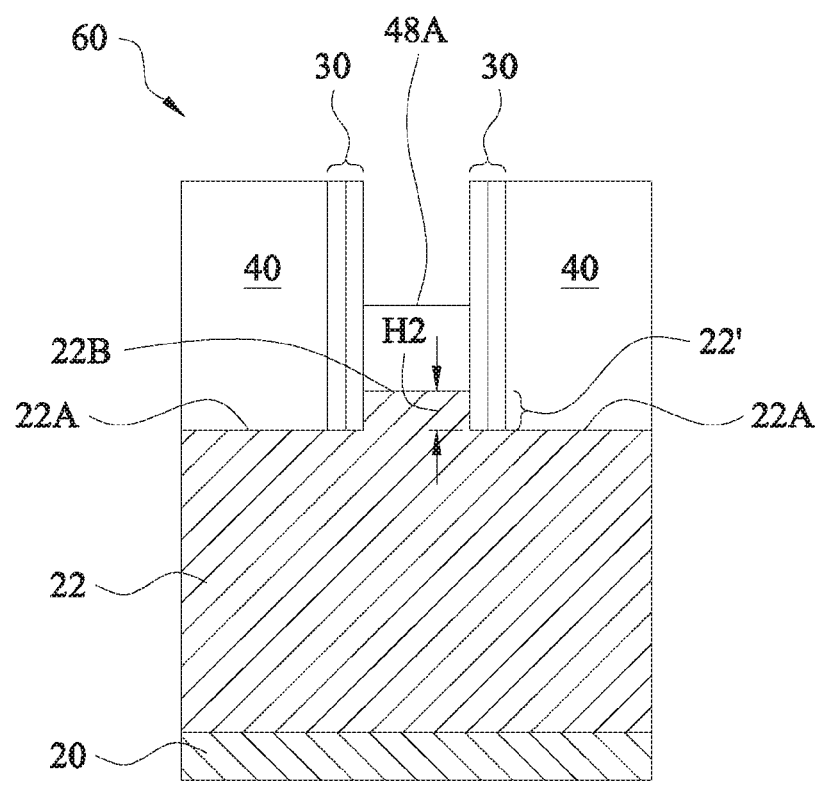

FIGS. 8C, 8D, and 8E illustrate cross-sectional views of the structure in FIG. 8A in accordance various embodiments, wherein the cross-sectional views are obtained from the plane crossing line 8C/8D/8E-8C/8D/8E in FIG. 8A. In some embodiments, as illustrated in FIGS. 8C and 8A, top surfaces 22B are level with top surfaces 22A of STI regions 22. In alternative embodiments, as shown in FIG. 8D, top surfaces 22B are lower than top surfaces 22A of STI regions 22. In yet alternative embodiments, as shown in FIGS. 8E, top surfaces 22B are higher than top surfaces 22A of STI regions 22. In FIG. 8E, portions 22' of STI regions 22 are located between opposite gate spacers 30, and the sidewalls of portions 22' are in contact with the sidewalls of gate spacers 30. Top surfaces 48A of semiconductor fins 48 are illustrated using a dashed line in FIGS. 8C, 8D, and 8E since semiconductor fin 48 is not in the planes illustrated in FIGS. 8C, 8D, and 8E.

Figure 9A:
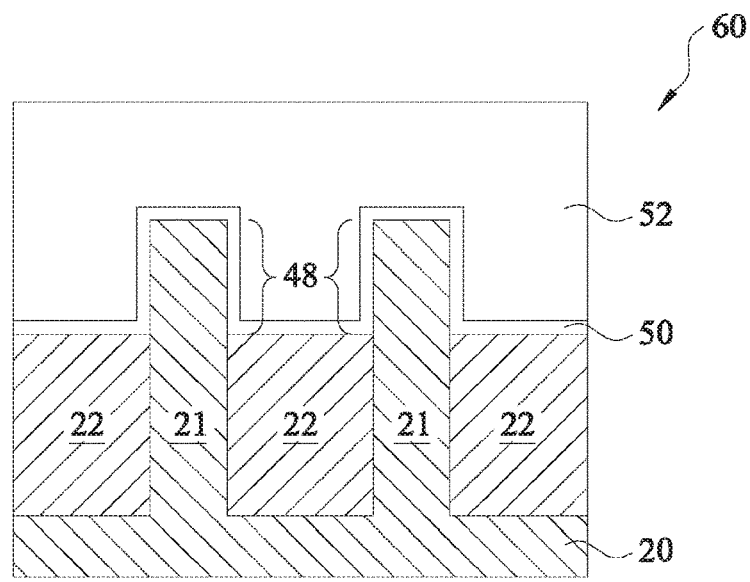
Figure 9B:
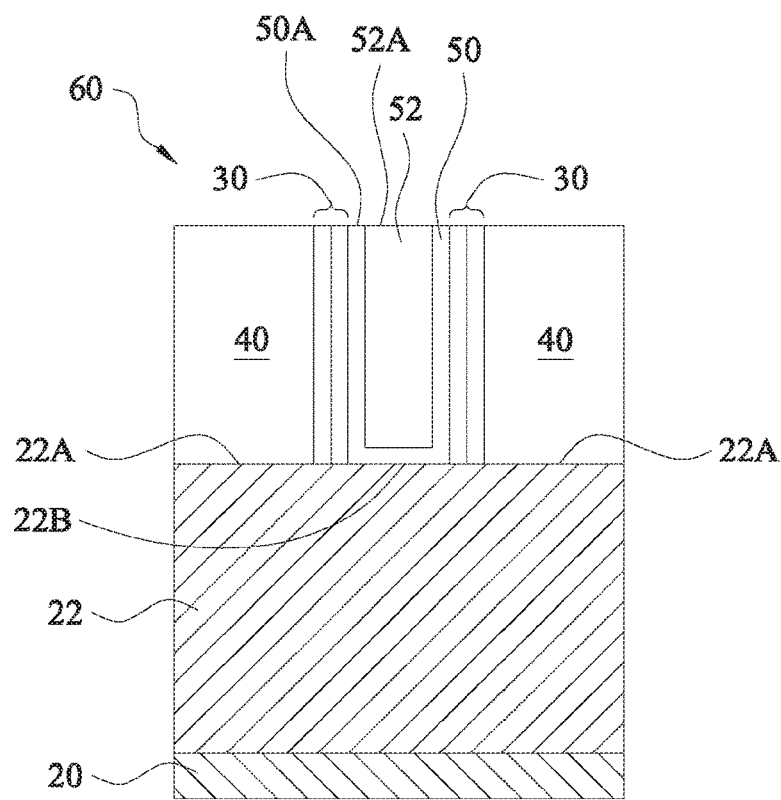

FIGS. 9A and 9B illustrate the formation of gate dielectric layer 50 and gate electrode 52. The cross-sectional view in FIG. 9A is obtained from the same plane that crosses lines 8B-8B in FIG. 8A. First, gate dielectric layer 50 is formed in recess 44 (FIG. 8A) and on the top surfaces and the sidewalls of semiconductor fins 48. In accordance with some embodiments, gate dielectric layer 50 comprises silicon oxide, silicon nitride, or multilayers thereof. In alternative embodiments, gate dielectric layer 50 comprises a high-k dielectric material, and hence is alternatively referred to as high-k gate dielectric layer 50 throughout the description. High-k gate dielectric layer 50 may have a k value greater than about 7.0, and may include a metal oxide or a silicate of Hf, Al, Zr, La, Mg, Ba, Ti, Pb, and combinations thereof. The formation methods of gate dielectric layer 50 may include Molecular-Beam Deposition (MBD), Atomic Layer Deposition (ALD), Physical Vapor Deposition (PVD), and the like.

Next, conductive material 52 is formed over gate dielectric layer 50, and fills the remaining recess 44 (FIG. 8A). Conductive material 52 may comprise a metal-containing material such as TiN, TaN, TaC, Co, Ru, Al, combinations thereof, and multi-layers thereof. The work function of conductive material 52 may be, or may not be, a band-edge work function, depending on whether the respective FinFET is a p-type FinFET or an n-type FinFET. After the filling of conductive material 52, a CMP may be performed to remove the excess portions of gate dielectric layer 50 and conductive material 52 over the top surface of ILD 40. The resulting remaining portions of the conductive material and gate dielectric layer 50 thus form the replacement gate, which includes gate electrode 52 and gate dielectric 50, respectively, of the resulting FinFET 60.

Figure 9C:
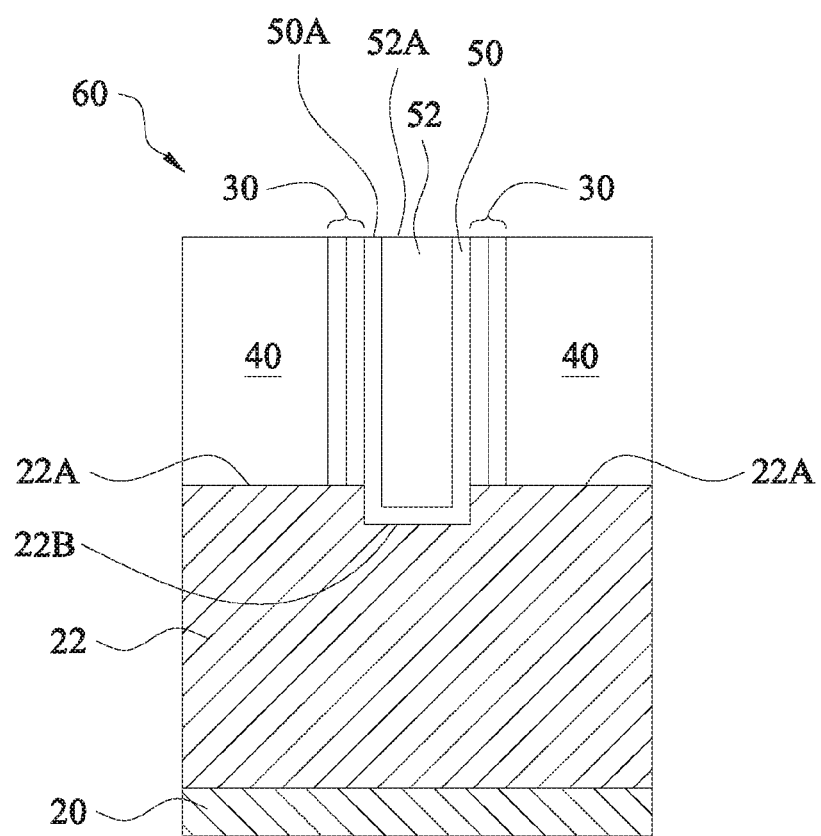
Figure 9D:
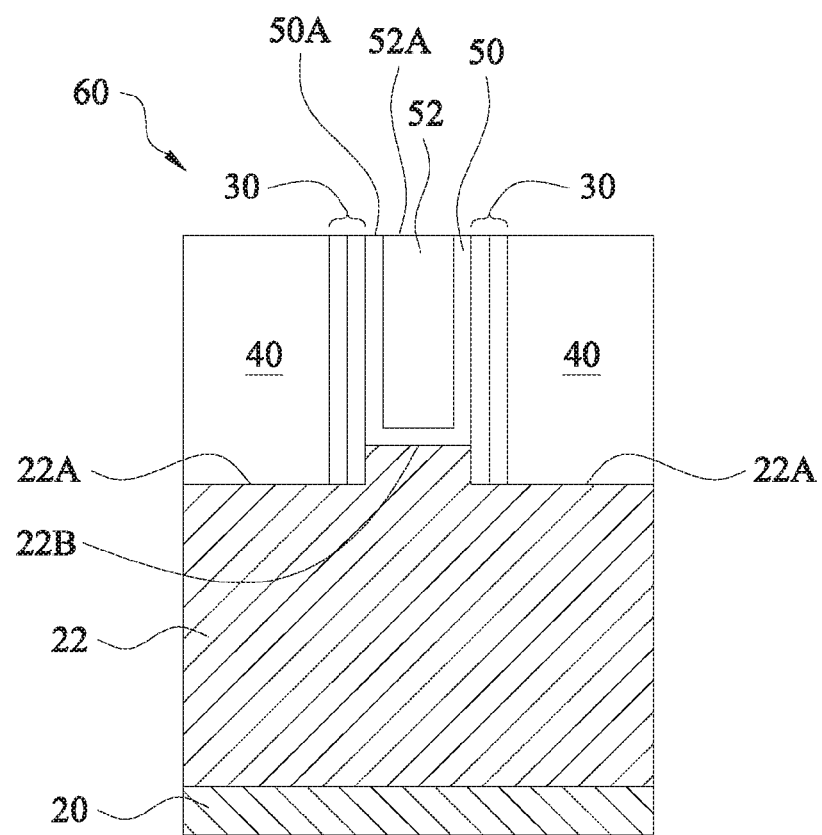

The cross-sectional views in FIGS. 9B, 9C, and 9D are obtained in accordance with various embodiments, and are obtained from the same plane that crosses line 8C/8D/8E-8C/8D/8E in FIG. 8A. Furthermore, FinFETs 60 in FIGS. 9B, 9C, and 9D are obtained from the structures in FIGS. 8C, 8D, and 8E, respectively. Referring to FIGS. 9B, 9C, and 9D, due to the replacement-gate formation process, top edge 50A of gate dielectric 50 is level with top edge 52A of gate electrode 52. In subsequent process steps, an additional ILD (not shown) may be formed over ILD 40, and contact plugs (not shown) may be formed to penetrate through the additional ILD and the underlying ILD 40 to electrically couple to gate electrode 52 and silicide regions 38 (FIG. 6). The formation of FinFET 60 is thus finished.

The FinFETs 60 in accordance with embodiments have replacement gates. By recessing STI regions to form semiconductor fins after the formation of source and drain regions, there is no need to form dummy oxides to cover the fins of core FinFETs when Input/output (IO) devices are formed. The profile of the semiconductor fins are thus not prone to the damage caused by the formation and the removal of the dummy oxides.

It is observed that in the resulting FinFET 60, the portions of STI regions 22 that are on the opposite sides of a same gate electrode 52 (FIGS. 9B, 9C, and 9D) have top surfaces 22A that are either higher than, level with, or lower than, top surface 22B that are underlying (and aligned to) gate electrode 52. This is different from the conventional FinFETs. In the conventional FinFETs, the STI regions 22 that are on the opposite sides of a gate electrode have top surfaces that are level with the top surface of the portion of the STI region that is underlying (and aligned to) the gate electrode.

FIGS. 10 through 21D illustrate cross-sectional views of intermediate stages in the formation of FinFETs in accordance with alternative embodiments. Unless specified otherwise, the materials and the formation methods of the components in these embodiments are essentially the same as their like components, which are denoted by like reference numerals in the embodiments shown in FIGS. 1 through 9D. The details regarding the formation process and the materials of the components shown in FIGS. 10 through 21D may thus be found in the discussion of the embodiments shown in FIGS. 1 through 9D.

Figure 10:
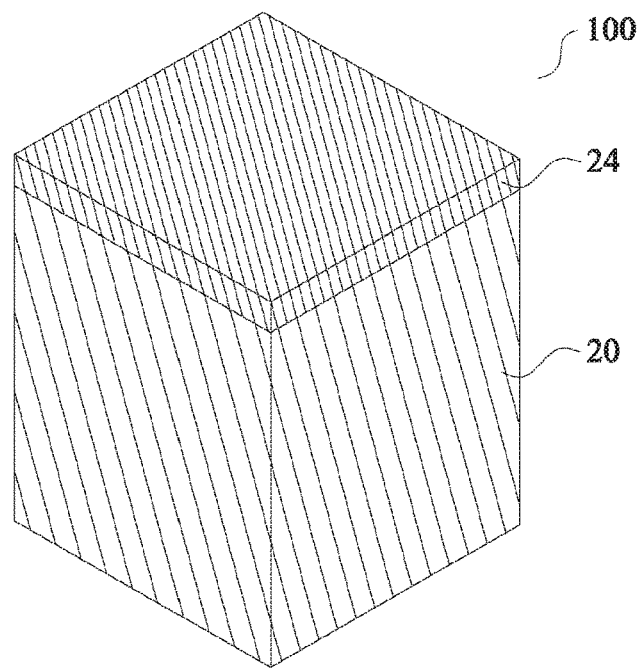
FIGS. 10 through 21D are perspective views and cross-sectional views of intermediate stages in the manufacturing of Fin Field-Effect Transistors (FinFETs) in accordance with alternative embodiments.

FIG. 10 illustrates a perspective view of an initial structure. The initial structure includes wafer 100, which includes substrate 20. Substrate 20 may be a semiconductor substrate, which may further be a silicon substrate, a silicon germanium substrate, or a substrate formed of another semiconductor material. Semiconductor substrate 20 may be doped with a p-type or an n-type impurity. Hard mask layer 24 is formed over substrate 20. Hard mask layer 24 may be in contact with the top surface of semiconductor substrate 20. Alternatively, a pad oxide layer (not shown) may be formed between substrate 20 and hard mask layer 24. In accordance with some embodiments of the present disclosure, hard mask layer 24 comprises a dielectric material such as silicon nitride. In alternative embodiments, materials such as silicon oxide, silicon carbide, metal nitrides such as titanium nitride and tantalum nitride, or the like may also be used to form hard mask layer 24.

Figure 11:
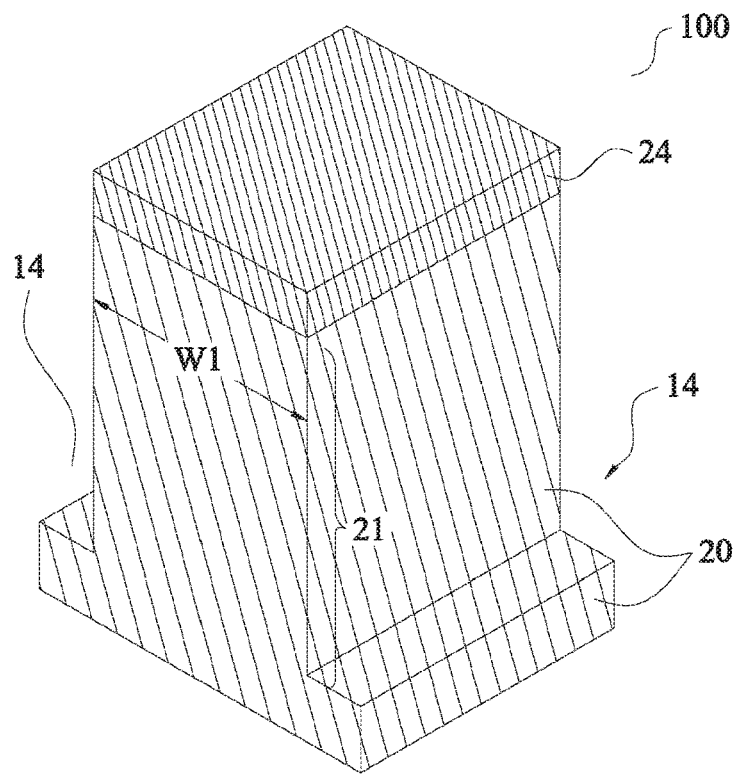

Referring to FIG. 11, an etching step is performed to form recesses 14 in semiconductor substrate 20. The portions of semiconductor substrate 20 between recesses 14 are referred to as semiconductor strip 21 hereinafter. In accordance with some embodiments, the etching is performed using an anisotropic etching method such as dry etching so that the sidewalls of semiconductor strip 21 and recesses 14 are substantially vertical. Hard mask layer 24 may then be removed. In accordance with some embodiments, width W1 of semiconductor strip 21 is in the range of about 100 nm to about 1 µm. It is appreciated, however, that the values given throughout the description are merely examples and may be changed to different values.

Figure 12:
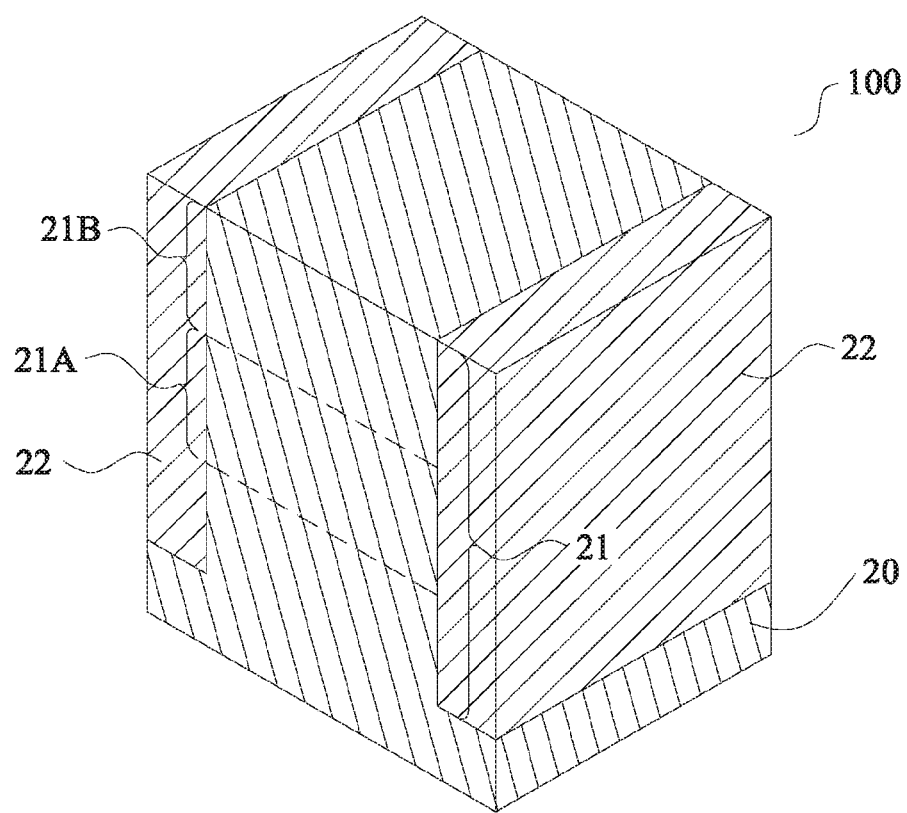

Recesses 14 as in FIG. 11 are then filled with a dielectric material such as an oxide. The filling of the dielectric material may be performed through, for example, High-Density Plasma (HDP) or Chemical Vapor Deposition (CVD). The dielectric material may also include an oxide formed using Flowable Chemical Vapor Deposition (FCVD), spin-on, or the like. A planarization step is then performed to remove excess portions of the dielectric material forming STI regions 22, as shown in FIG. 12. STI regions 22 may extend from a top surface of semiconductor substrate 20 into semiconductor substrate 20 itself. The top surfaces of semiconductor strip 21 and the top surfaces of STI regions 22 may be substantially level with each other, or may be at slightly different levels.

In accordance with some embodiments, the top portion of semiconductor strip is replaced with an epitaxy semiconductor material. In some exemplary embodiments, the FinFET 54 (FIGS. 20A and 20B) that is to be formed is a p-type FinFET, and semiconductor strip 21 includes silicon germanium (SiGe) region 21A and substantially pure germanium region 21B over SiGe region 21A. In alternative exemplary embodiments, the FinFET 54 that is to be formed is an n-type MOSFET, and semiconductor strip 21 would then include silicon germanium (SiGe) region 21A and substantially pure silicon region 21B over SiGe region 21A. In these embodiments, semiconductor strip 21 may be formed by etching a top portion of substrate strip 21 between STI regions 22 and epitaxially growing the epitaxy semiconductor material between STI regions 22.

Figure 13:
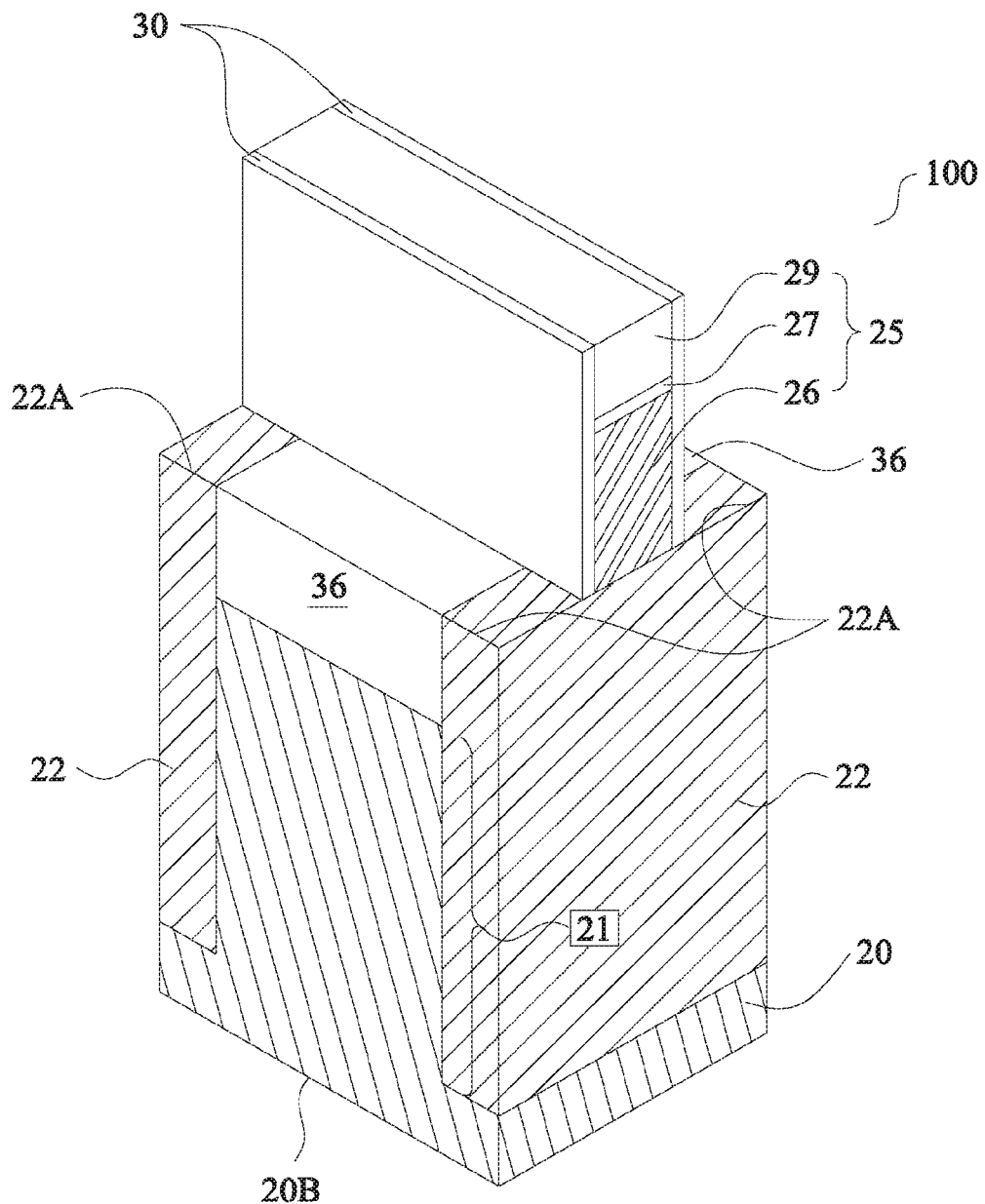

Referring to FIG. 13, dummy gate stack 25 is formed to cover the middle portions of semiconductor strip 21 (FIG. 12), with the end portions of semiconductor strip 21 not covered by dummy gate stack 25. The gate stack 25 is formed on the top surface of semiconductor strip 21 (refer to FIG. 12). In some embodiments, gate stack 25 includes dummy gate electrode 26, pad oxide layer 27 over dummy gate electrode 26, and hard mask layer 29 over pad oxide layer 27. Gate stack 25 may also include different structures/layers in alternative embodiments. Gate stack 25 may have a substantially planar bottom surface, which has a first portion overlapping semiconductor strip 21 and second portions overlapping STI regions 22, wherein the first portion and the second portions of the bottom surface of gate stack 25 are substantially coplanar.

Dummy gate electrode 26 may be formed from, for example, polysilicon while other materials may also be used. Pad oxide layer 27 may include silicon oxide. Hard mask layer 29 may comprise silicon nitride, silicon carbide, silicon oxynitride, or the like. Gate stack 25 has a lengthwise direction substantially perpendicular to the lengthwise direction of semiconductor strip 21. Although not shown, there may be a dummy gate dielectric, which may be a silicon oxide layer, formed between semiconductor strip 21 and dummy gate electrode 26.

In some embodiments, gate spacers 30 are formed on the sidewalls of gate stack 25. Gate spacers 30 may comprise silicon carbonitride (SiCN), silicon nitride, silicon oxynitride, or the like, and may have a single-layer structure or a multi-layer structure including different materials forming different layers. In alternative embodiments, no gate spacers are formed, and the subsequently formed dielectric mask layer 39 (FIG. 15) is in contact with dummy gate stack 25.

FIG. 13 also illustrates the formation of source and drain regions 36 (referred to as source/drain regions hereinafter). In the exemplary process for forming the source/drain regions 36, an etching step (referred to as source/drain recessing hereinafter) is performed to etch the exposed end portions of semiconductor strip 21 not covered by gate stack 25 and gate spacers 30. The recessing may be anisotropic, and hence the portions of semiconductor strip 21 directly underlying gate stack 25 and gate spacers 30 are protected and are not etched. The top surfaces of the recessed semiconductor strip 21 are lower than the top surfaces 22A of STI regions 22.

Next, source/drain regions 36 are epitaxially grown from the recesses between neighboring STI regions 22. In some exemplary embodiments, source/drain regions 36 comprise silicon germanium or silicon phosphorous. Depending on whether the resulting FinFET is a p-type FinFET or an n-type FinFET, a p-type or an n-type impurity may be in-situ doped with the proceeding of the epitaxy. For example, when the resulting FinFET is a p-type FinFET, SiGeB may be grown. Conversely, when the resulting FinFET is an n-type FinFET, SiP may be grown. In alternative embodiments, source/drain regions 36 comprise III-V compound semiconductors such as GaAs, InP, GaN, InGaAs, InAlAs, GaSb, AlSb, AlAs, AlP, GaP, combinations thereof, or multi-layers thereof.

Figure 20A:
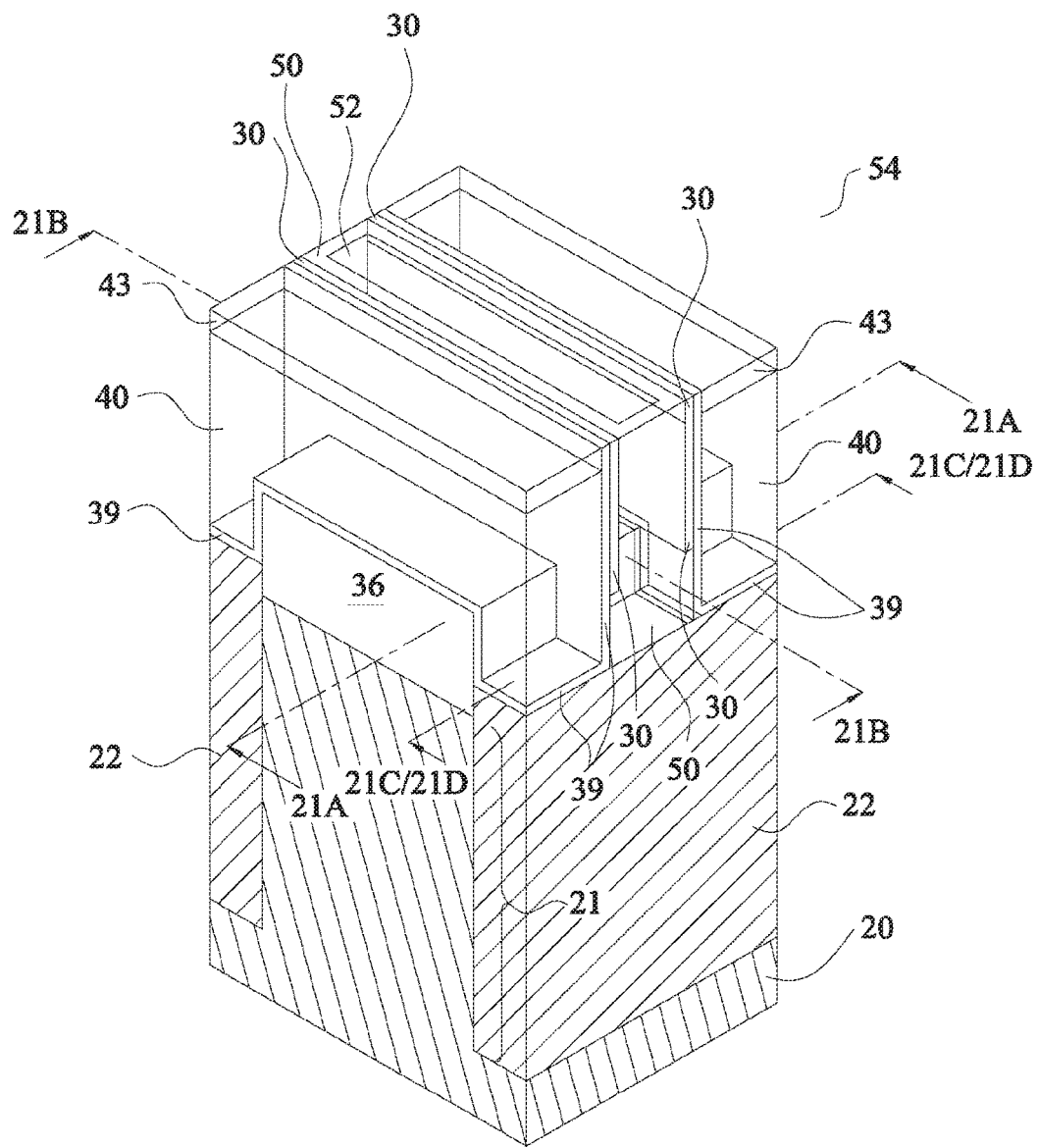
Figure 20B:
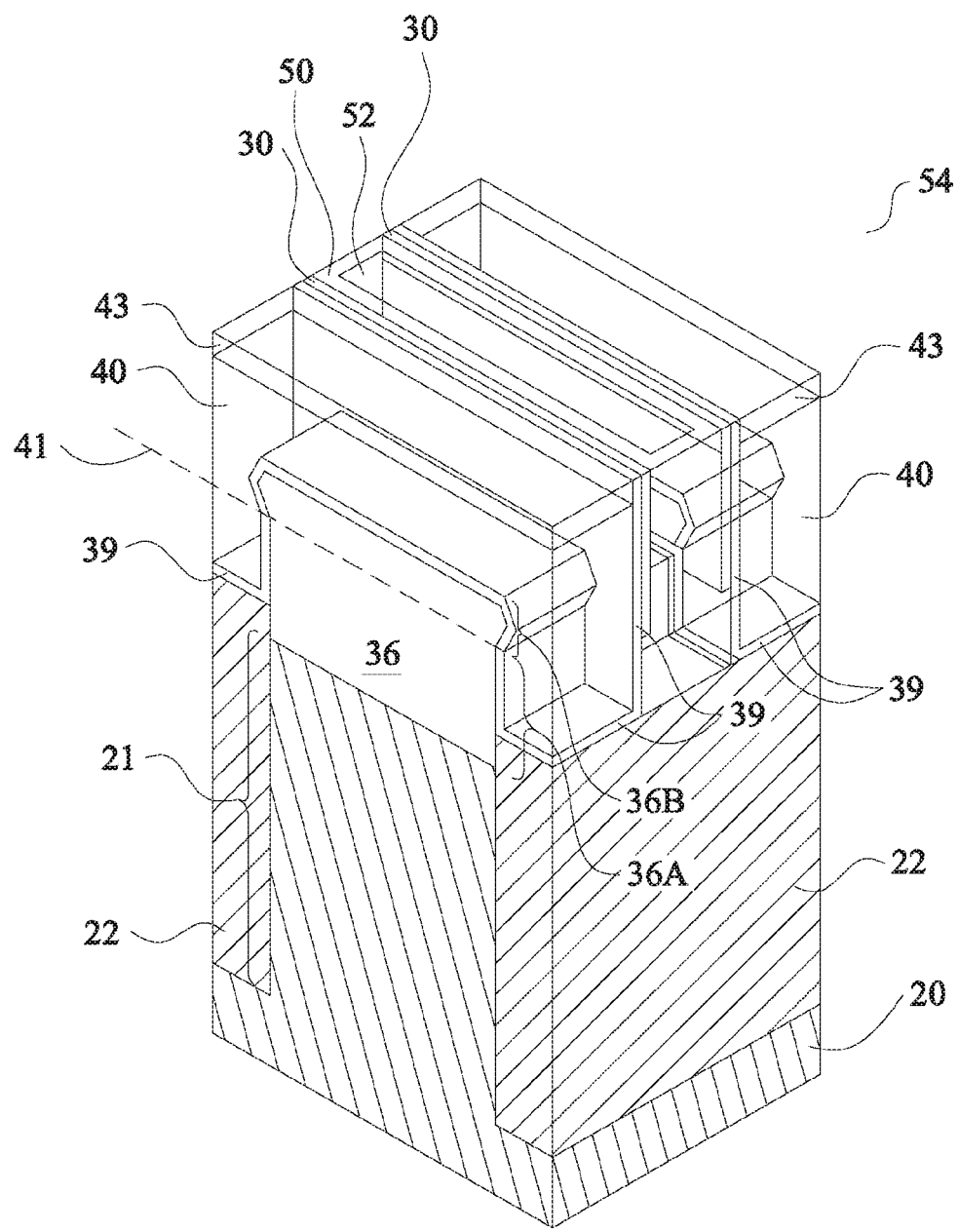

In accordance with some embodiments of the present disclosure, the epitaxy growth of source/drain regions 36 stops when the top surfaces of source/drain regions 36 are higher than the top surfaces 22A of STI regions 22. The resulting source/drain regions 36 are illustrated in FIG. 20B. In these embodiments, source/drain regions 36 may include lower portions 36A (FIG. 20B) that are formed in STI regions 22 and upper portions 36B that are formed over the top surfaces 22A (FIG. 13) of STI regions 22. Lower portions 36A, whose sidewalls are shaped by the opposite edges of STI regions 22, may have (substantially) straight edges, which may also be vertical edges that are perpendicular to the major surfaces (such as bottom surface 20B in FIG. 13) of substrate 20. For example, the tilt angle θ of the sidewalls of lower portions 36A may be in the range of about 80 degrees to 90 degrees.

In accordance with alternative embodiments of the present disclosure, as shown in FIG. 13, the epitaxy growth of source/drain regions 36 stops when the top surfaces of source/drain regions 36 are level with or lower than top surfaces 22A of STI regions 22. Accordingly, the sidewalls of the respective source/drain regions 36 are substantially straight and vertical, following the profile of the sidewalls of STI regions 22.

After the epitaxy step, source/drain regions 36 may be further implanted with a p-type or an n-type impurity to form source and drain regions. In alternative embodiments, the implantation step is skipped since the source and drain regions 36 are formed during the epitaxy due to the in-situ doping of the p-type or n-type impurity. Source and drain regions 36 are on opposite sides of gate stack 25.

Figure 14:
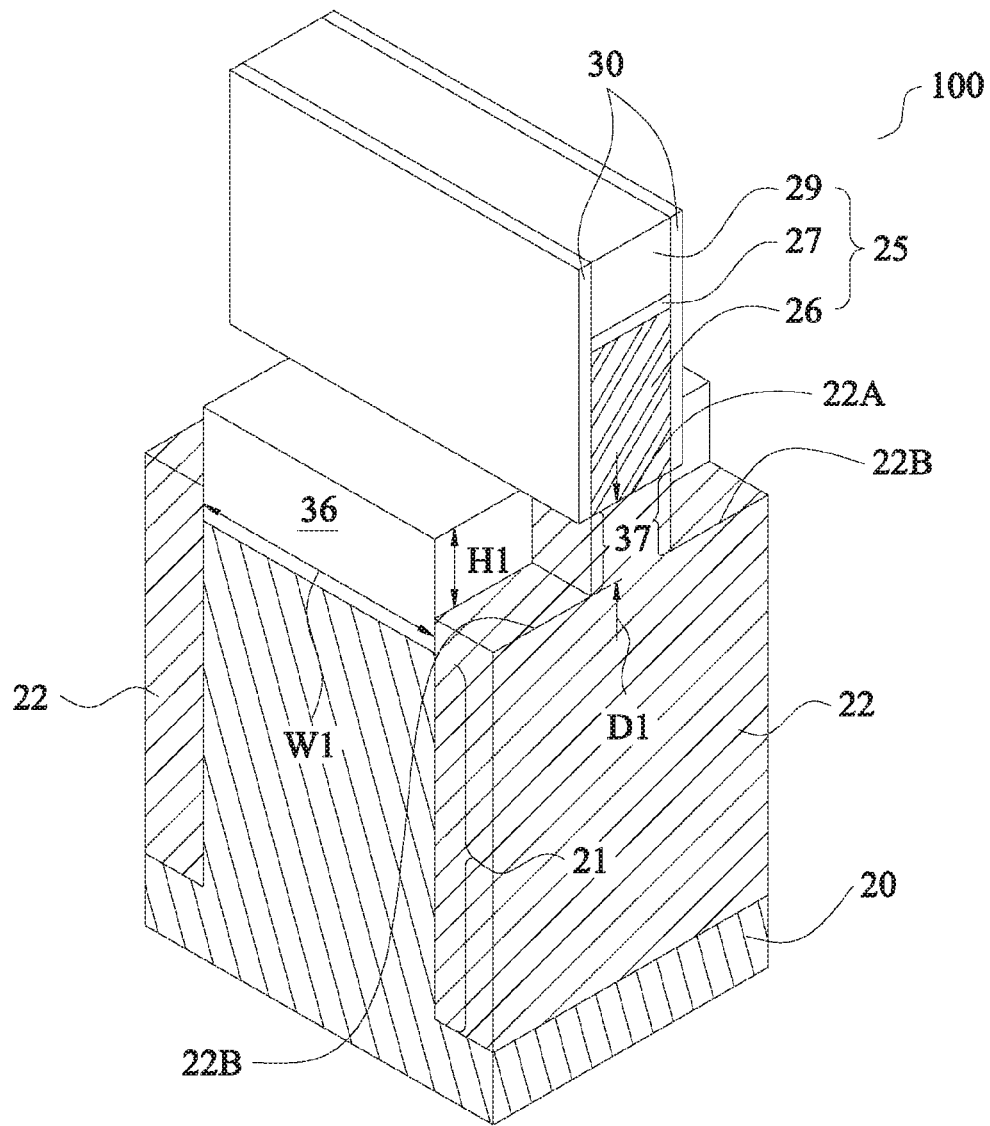

FIG. 14 illustrates the recess of STI regions 22 through an STI recessing step, which is performed through etching. The etching may be performed as a dry etching process. In some embodiments, the etching gases include HF and NH$_3$. In alternative embodiments, the etching gases include NF$_3$ and NH$_3$. In alternative embodiments, a wet etching is performed, wherein diluted HF may be used as an etchant. The recessed top surfaces of STI regions 22 are referred to as 22B, which are lower than top surfaces 22A. The recessing depth D1, which is the difference between the heights of top surfaces 22A and 22B, may be in the range of 10 nm to 500 nm in some exemplary embodiments. The space occupied by the etched portions of STI regions 22 are referred to as recesses 37. The recessing may be anisotropic so that the edges of STI regions 22 exposed to recesses 37 are substantially vertical.

In accordance with some embodiments, width D1 of source/drain regions 36 is greater than recessing depth D1. Accordingly, the portions of source/drain regions 36 over top surface 22B have a width W1 greater than their height H1. In these embodiments, height H1 may be equal to, greater than, or smaller than recessing depth D1. In some embodiments, ratio W1/H1 is greater than about 1.0 and may be greater than about 5.0 or higher. The resulting FinFET in accordance with these embodiments are different from typical FinFETs, in which the portions of source/drain regions higher than surrounding STI regions may have heights higher than the respective widths. The respective FinFET 54 (FIGS. 20A and 20B) is hence sometimes referred to as a quasi FinFET since its shape is close to a planar FET device due to its width and low fin height, as also shown in FIGS. 20A and 20B.

In alternative embodiments, ratio W1/H1 is smaller than 1.0 and may be smaller than about, for example, 0.2. The resulting source/drain regions 36 may then have tall and narrow shapes.

In accordance with the embodiments of the present disclosure, after the STI recessing, the recessed top surfaces 22B of STI regions 22 are below top surfaces 22A, which are also at a level at which portions 36B (if there are any, as shown in FIG. 20B) of source/drain regions 36 join the respective underlying portions 36A of source/drain regions 36. Level 41 is also at the level of top surfaces 22A of STI regions 22. The sidewalls of source/drain regions 36 are exposed. Furthermore, the recessed top surfaces 22B of STI regions 22 may be higher than, level with, or lower than the interfaces between semiconductor strip 21 and the overlying source/drain regions 36.

Figure 15:
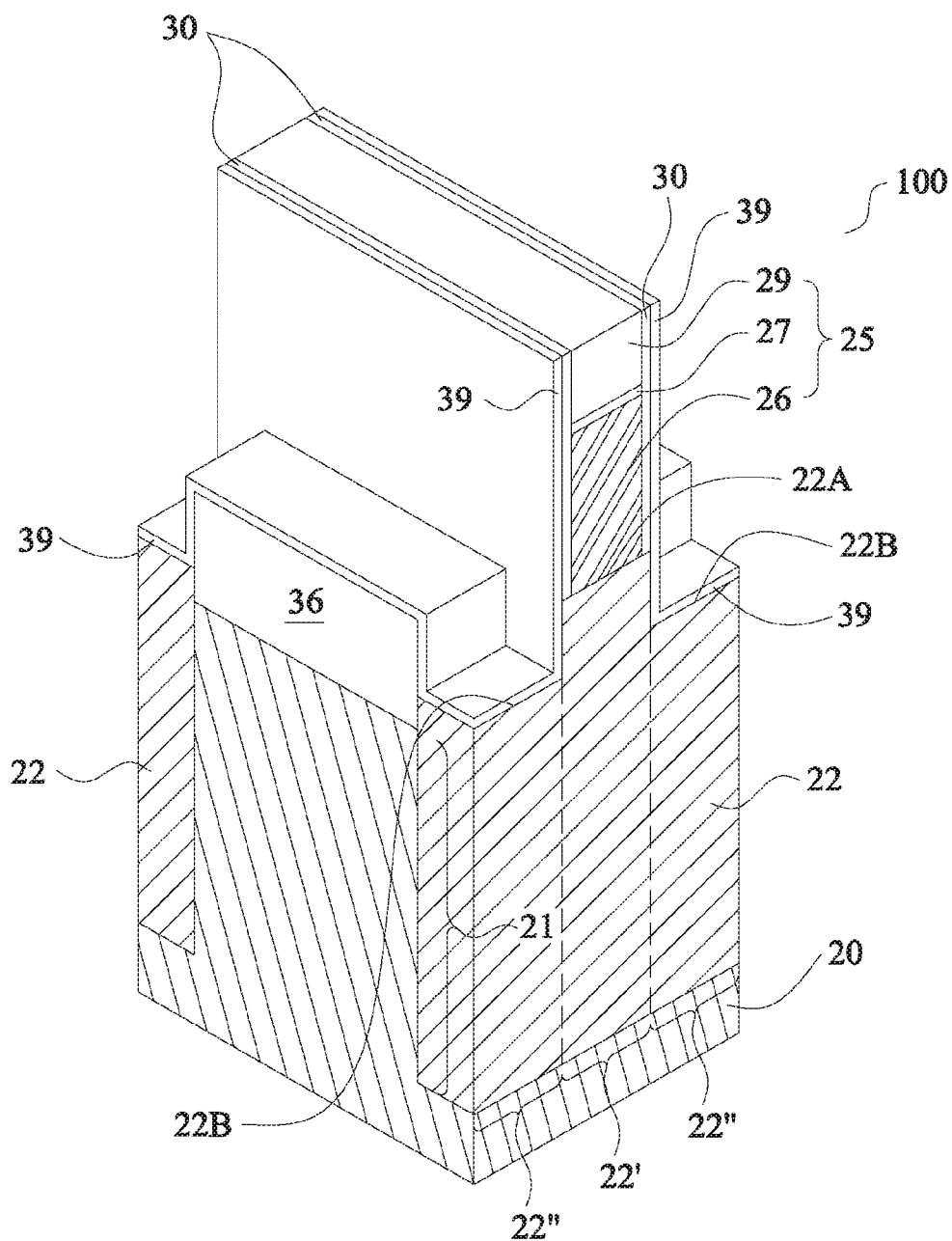

FIG. 15 illustrates the formation of dielectric mask layer 39, which is formed to cover the exposed surfaces in the structure shown in FIG. 14. In accordance with some embodiments, dielectric mask layer 39 is formed as a conformal layer, which may be formed using a conformal deposition method such as Atomic Layer Deposition (ALD). The material of dielectric mask layer 39 is selected to have a high etching selectivity from STI regions 22 and the materials in dummy gate stack 25, so that in the subsequent processes for etching STI regions 22 and dummy gate stack 25, dielectric mask layer 39 is not etched. For example, the material of dielectric mask layer 39 is different from the materials of STI regions 22 and the materials in dummy gate stack 25. In accordance with some exemplary embodiments, dielectric mask layer 39 is formed of silicon nitride. In alternative embodiments, dielectric mask layer 39 is formed of an oxide, a carbide, an oxycarbide, an oxynitride, a carbo-oxynitride, or the like depending on the materials of STI regions 22 and the materials of dummy gate stack 25.

Dielectric mask layer 39 includes portions on the sidewalls of dummy gate stack 25 as well as the sidewalls and the top surfaces of source/drain regions 36. In the embodiments in which semiconductor strip 21 is exposed in the recessing of STI regions 22, dielectric mask layer 39 may also be in contact with the sidewalls of the exposed portions of semiconductor strip 21. Furthermore, dielectric mask layer 39 includes portions on the sidewalls of portions 22' of STI regions 22, which underlie dummy gate stack 25. Dielectric mask layer 39 may also include portions on the top surfaces 22B of portions 22" of STI regions 22.

Figure 16:
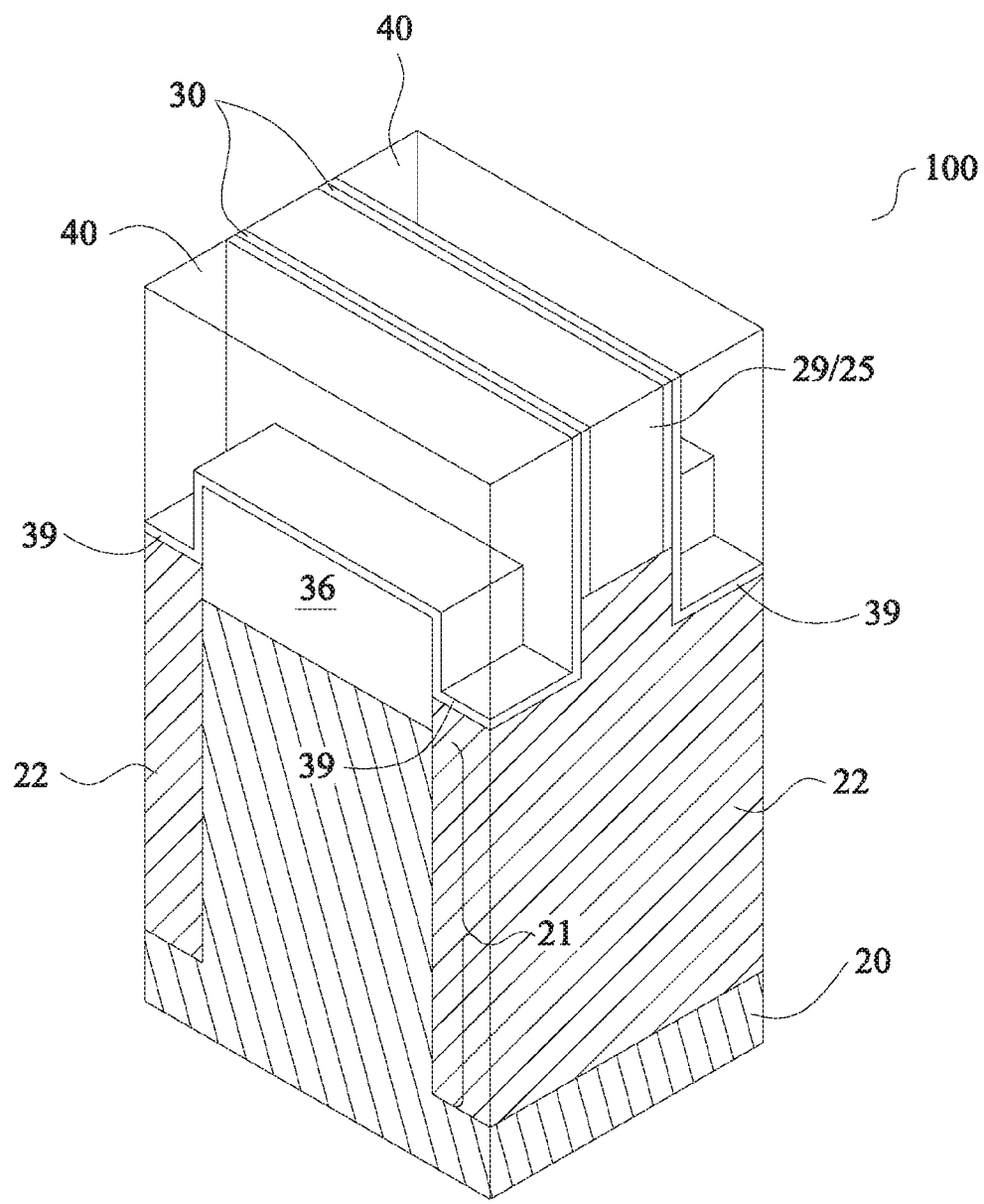

FIG. 16 illustrates a perspective view of the structure after Inter-Layer Dielectric (ILD) 40 is formed. In some embodiments, ILD 40 comprises an oxide formed using, for example, Flowable Chemical Vapor Deposition (FCVD), spin-on, or the like. ILD 40 may also include Phospho-Silicate Glass (PSG), Boro-Silicate Glass (BSG), Boron-Doped Phospho-Silicate Glass (BPSG), Tetra Ethyl Ortho Silicate (TEOS) oxide, or the like in alternative embodiments. ILD 40 is filled until its top surface is higher than the top surface of dummy gate stack 25 in FIG. 15.

In some embodiments, after the material of ILD 40 is filled, a CMP is performed to remove excess portions of ILD 40. In some embodiments, the CMP is performed using dummy gate electrode 26 as a CMP stop layer. Accordingly, pad oxide layer 27 and hard mask layer 29 (FIG. 15) are removed as a result of the CMP. In alternative embodiments, pad oxide layer 27 (FIG. 15) is used as a CMP stop layer, and hence hard mask layer 29 (FIG. 15) is removed as a result of the CMP. In yet alternative embodiments, hard mask layer 29 (FIG. 15) is used as a CMP stop layer. Accordingly, after the CMP, pad oxide layer 27 and hard mask layer 29 will remain, with the top surface of hard mask layer 29 coplanar with the top surface of ILD 40.

Figure 17:
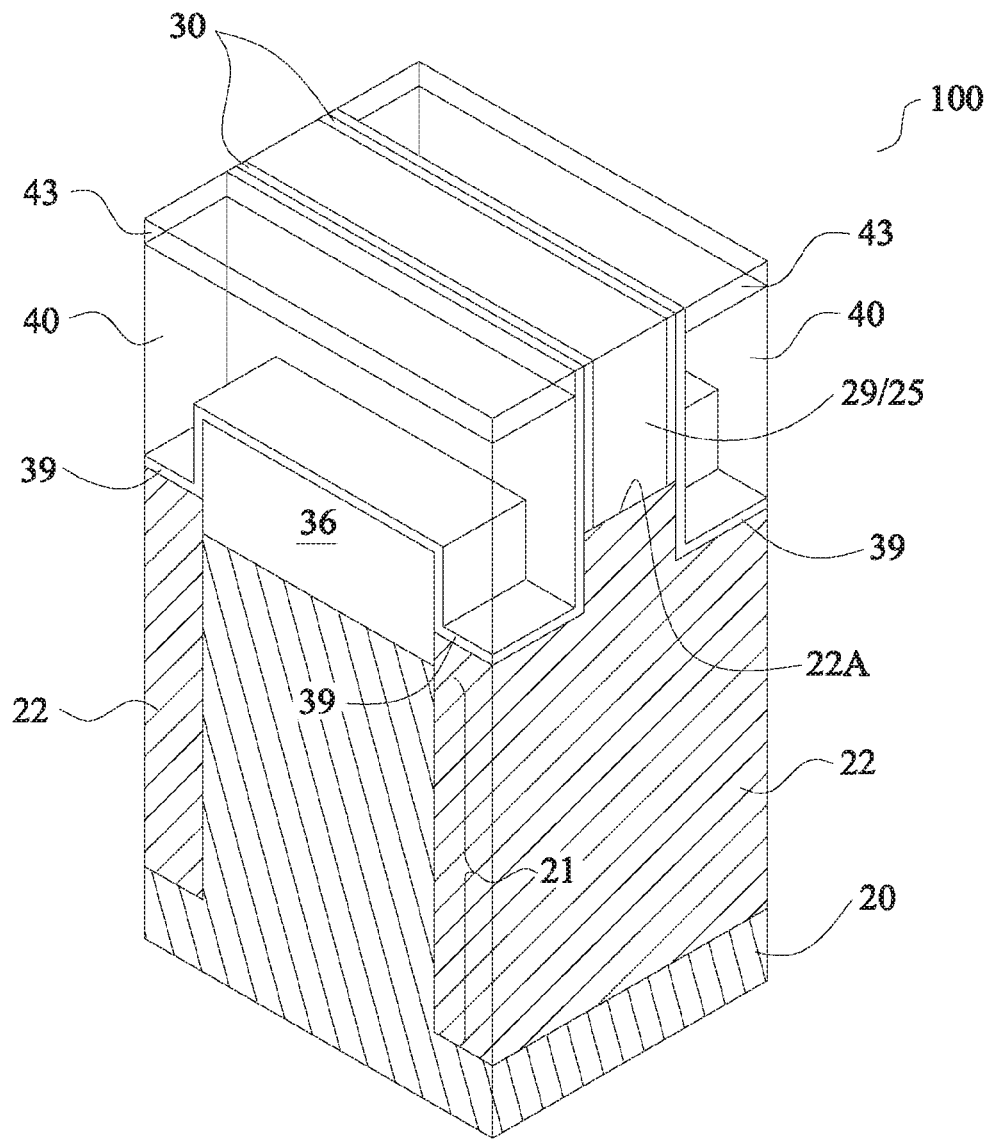

FIG. 17 illustrates the formation of hard mask layer 43, which is formed as a horizontal layer over ILD 40. The formation includes the etching of a top surface layer of ILD 40 to form a recess (filled by hard mask layer 43) with dummy gate stack 25 substantially un-etched. A dielectric material is then filled in the recess. Another CMP is then performed to remove excess portions of the dielectric material over dummy gate stack 25. The remaining portions of the dielectric material thus make up hard mask layer 43. In accordance with some embodiments, dielectric mask layer 43 comprises a material having etching characteristics close to, or the same as, that of dielectric mask layer 39. In some exemplary embodiments, dielectric mask layers 39 and 43 are formed of a same dielectric material such as silicon nitride, silicon oxide, silicon carbide, silicon oxynitride, or the like. The edges of dielectric mask layer 43 are in contact with the edges of dielectric mask layer 39.

Figure 18:
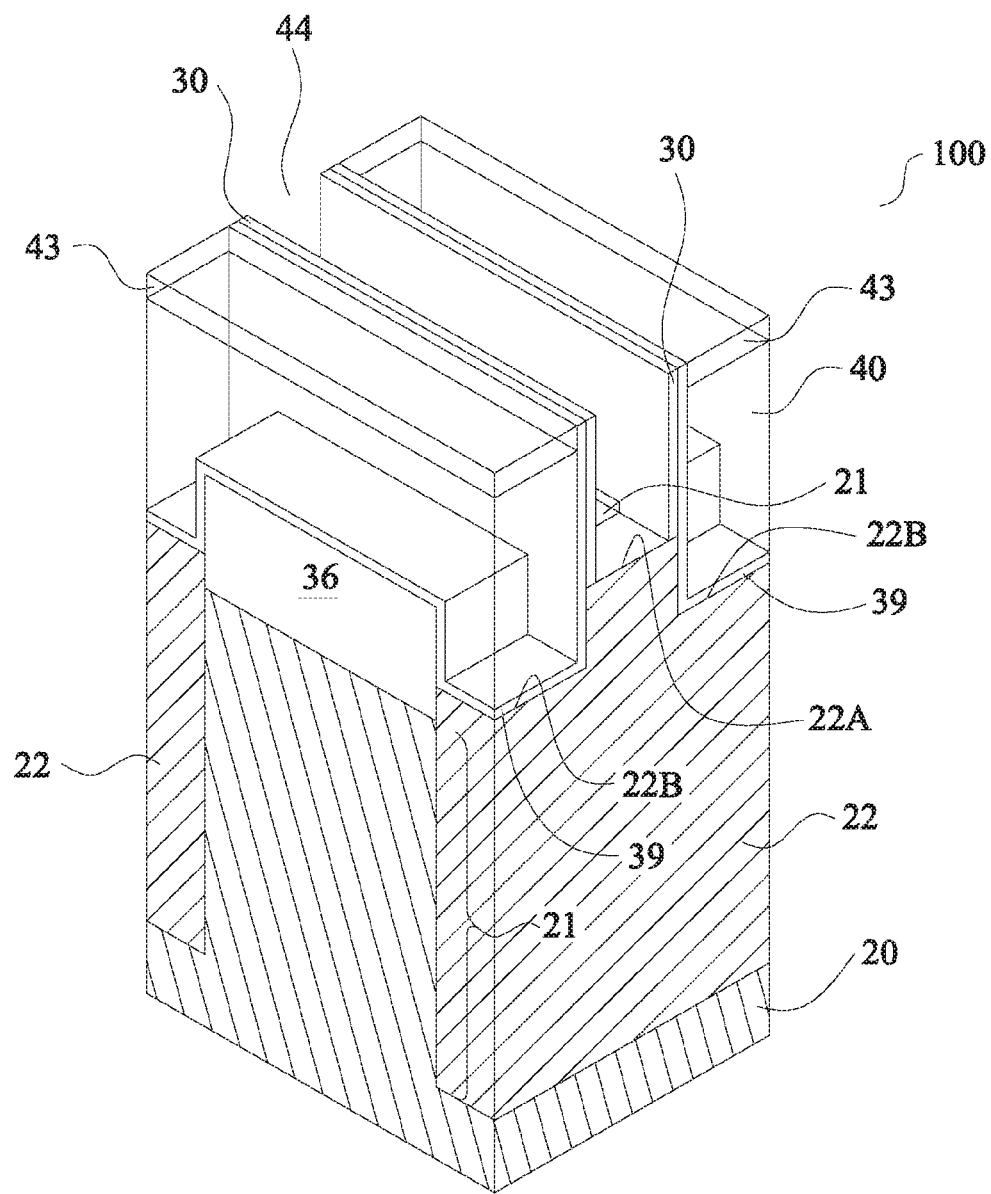
Figure 19:
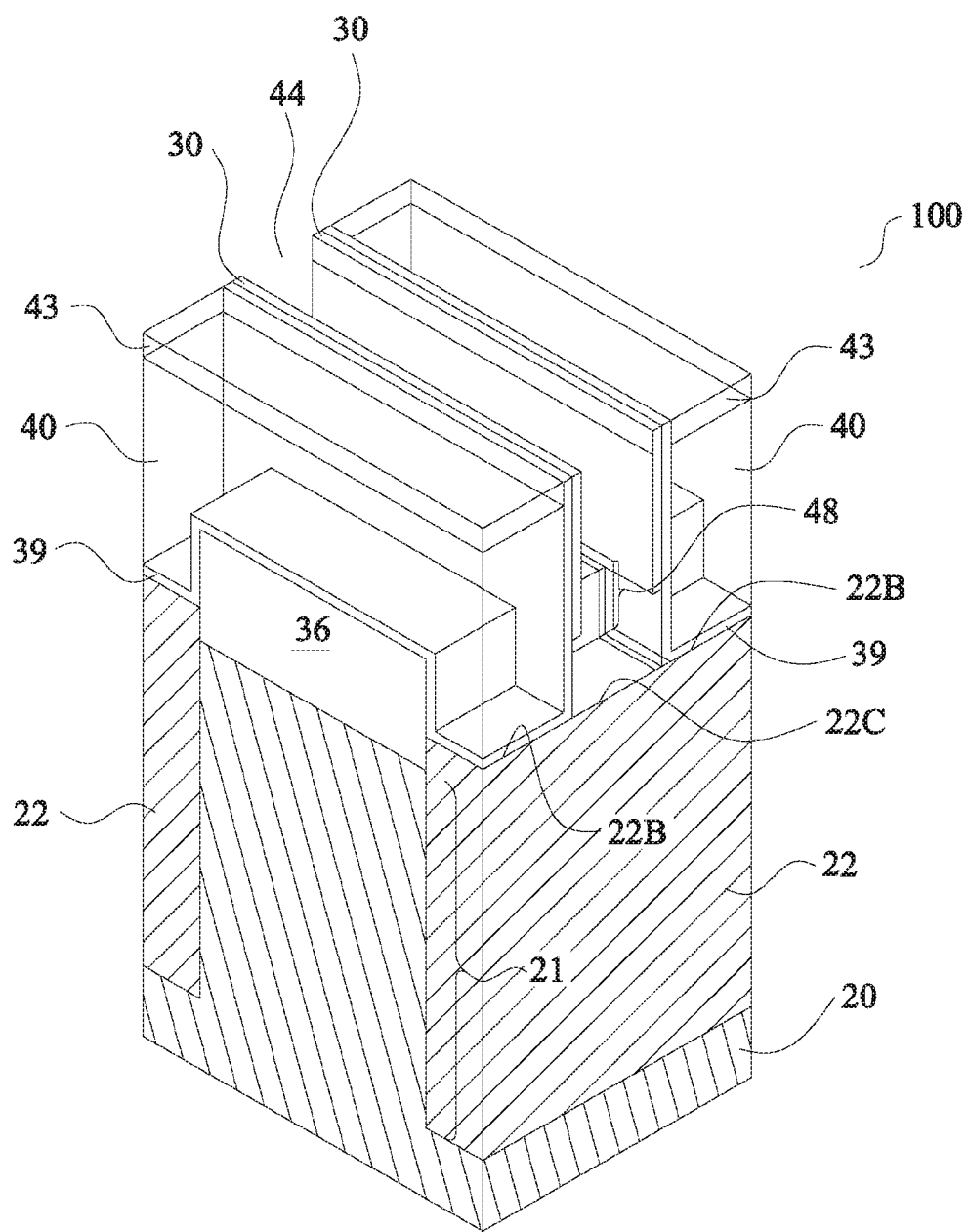

Next, dummy gate stack 25 is etched, forming recess 44, as shown in FIGS. 18 and 19. The etching may be performed using wet etching processes in accordance with some exemplary embodiments of the present disclosure. In the etching step, the etchant is selected so that dielectric mask layers 43 and 39 are not etched while dummy gate stack 25 (FIG. 17) is etched. Hence, dielectric mask layers 39 and 43 in combination act as a protection layer to protect ILD 40 and source/drain regions 36.

The etching includes two stages. The first stage is shown in FIG. 18. In the first stage, dummy gate stack 25 is etched so that top surface 22A of STI regions 22 and semiconductor strip 21 are exposed through recess 44.

Next, as shown in FIG. 19, in the second stage, an etchant that attacks STI regions 22, but does not attack semiconductor strip 21 and dielectric mask layers 39 and 43, and gate spacers 30 (if any), is used. Accordingly, the portions of STI regions 22 under recess 44 are etched. The resulting top surfaces of the recessed STI regions 22 are denoted as 22C. In accordance with some embodiments, top surfaces 22C are higher than top surfaces 22B and lower than top surfaces 22A (22A is shown in FIG. 17). In alternative embodiments, top surfaces 22C are coplanar with or substantially coplanar with top surfaces 22B. Each top surfaces 22B and 22C may be higher than, level with, or lower than, the bottom surfaces of source/drain regions 36 in any combination.

It is appreciated that although the etching including two stages, the first stage and the second stage may be performed continuously using the same etchant, with no break between. Alternatively, the first stage and the second stage may be performed using different etchants and may be performed using different etching methods such as dry etching, wet etching, or the like.

The second etching stage results in the formation of semiconductor fin 48, which is a top portion of semiconductor strip 21 (FIG. 12). Semiconductor fin 48 may have a fin height substantially equal to the height difference between the height of top surface 22A (FIG. 18) and the height of top surface 22C. The height of fin 48 may be great, providing the top surface 22C is not lower than top surface 22B of STI regions 22. The greater fin height results in the desirable increase in the effective channel width of the resulting FET and an increase in the saturation current of the FET.

By forming dielectric mask layer 39, when STI regions 22 is recessed as shown in FIG. 19, dielectric mask layer 39 limits the etching of STI regions 22 to the downward direction and prevents lateral etching from occurring, wherein the lateral etching results in the undercut under gate spacers 30. Since the undercut will be filled by a replacement gate in a subsequent step, the undercut may cause the electrical shorting of the replacement gate to source/drain regions 36. Hence, dielectric mask layer 39 has the function of preventing the undesirable electrical shorting.

FIGS. 20A and 20B illustrate the formation of a replacement gate. A gate dielectric layer and a gate electrode layer are first formed to fill recess 44 as shown in FIG. 19, followed by a CMP to remove excess portions of the gate dielectric layer and the gate electrode layer. The remaining portions of the gate dielectric layer and the gate electrode layer in recess 44 (FIG. 19) form the replacement gate. As shown in FIGS. 20A and 20B, the resulting replacement gate includes gate dielectric 50 and gate electrode 52. Gate dielectric 50 may comprise a high-k dielectric material with a k value greater than about 7.0, for example, and gate electrode 52 may comprise a metal or a metal alloy. Gate dielectric 50, gate electrode 52, and source and drain regions 36 in combination form FinFET 54.

FIG. 20A illustrates the embodiment wherein source/drain regions 36 have straight and vertical edges. The embodiment as shown in FIG. 20A is obtained by stopping the epitaxy of source/drain regions 36 (FIG. 13) before the top surfaces of source/drain regions 36 are higher than top surfaces 22A (shown in FIGS. 21A-21D) of STI regions 22. FIG. 20B illustrates the embodiment wherein source/drain regions 36 include lower portion 36A having straight and vertical edges and upper portion 36B having facets. The embodiment as shown in FIG. 20B is obtained by stopping the epitaxy of source/drain regions 36 (FIG. 13) after the top surfaces of source/drain regions 36 are higher than top surfaces 22A of STI regions 22.

Figure 21A:
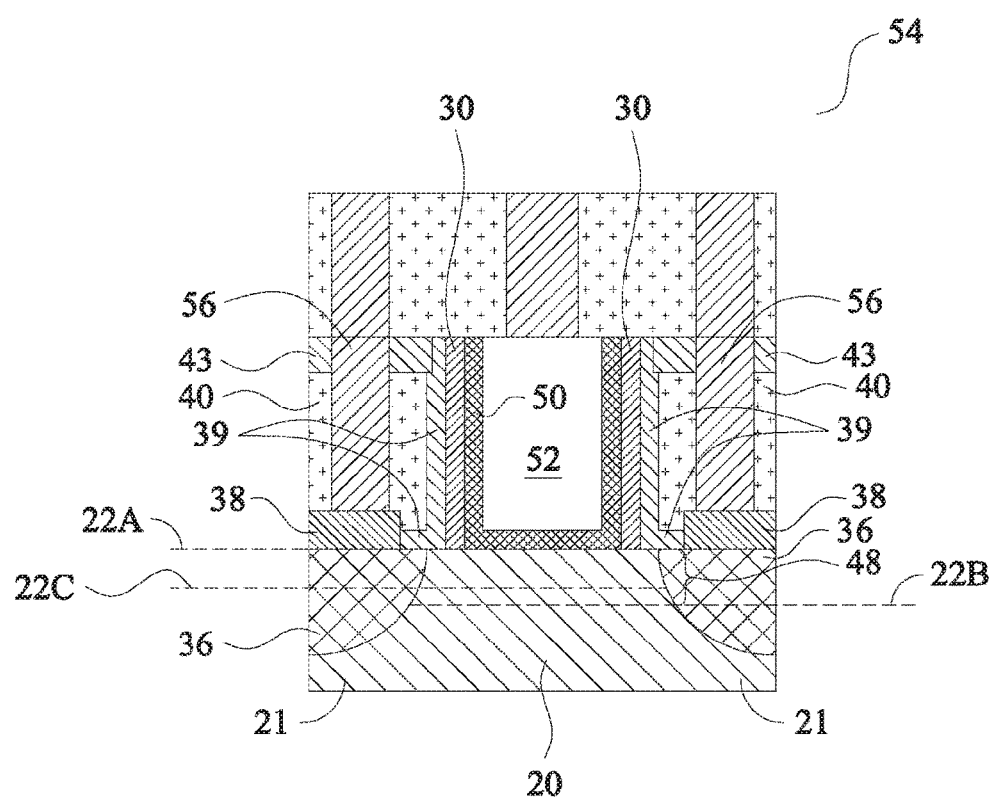

In a subsequent step, source/drain contact plugs are formed to electrically couple to source/drain regions 36. FIG. 21A illustrates a cross-sectional view obtained from the same vertical plane containing line 21A-21A in FIG. 20, except that in FIG. 21A, source/drain silicide regions 38 and contact plug 56 have been formed. The formation of the source/drain silicide regions 38 and contact plug 56 may include the etching of dielectric mask layer 43 and ILD 40 to form a contact plug opening, the etching of dielectric mask layer 39 (refer to FIG. 18) through the contact opening to expose sourced/drain regions 36, the siliciding of surface portions of source/drain regions 36 to form silicide regions 38, and the filling of the contact openings with a conductive material to form contact plugs 56. A CMP is performed to level the top surface of contact plug 56 with the top surface of dielectric mask layer 43, as shown in FIG. 21A. Hence, contact plug 56 extends into both dielectric mask layer 43 and ILD 40 to electrically couple to source/drain region 36.

STI regions 22 (not shown in FIG. 21A, refer to FIGS. 20A and 20B) include top surfaces 22A and 22B, wherein top surface 22B may be lower than the interface between source/drain regions 36 and semiconductor strip 21 in some embodiments.

Figure 21B:
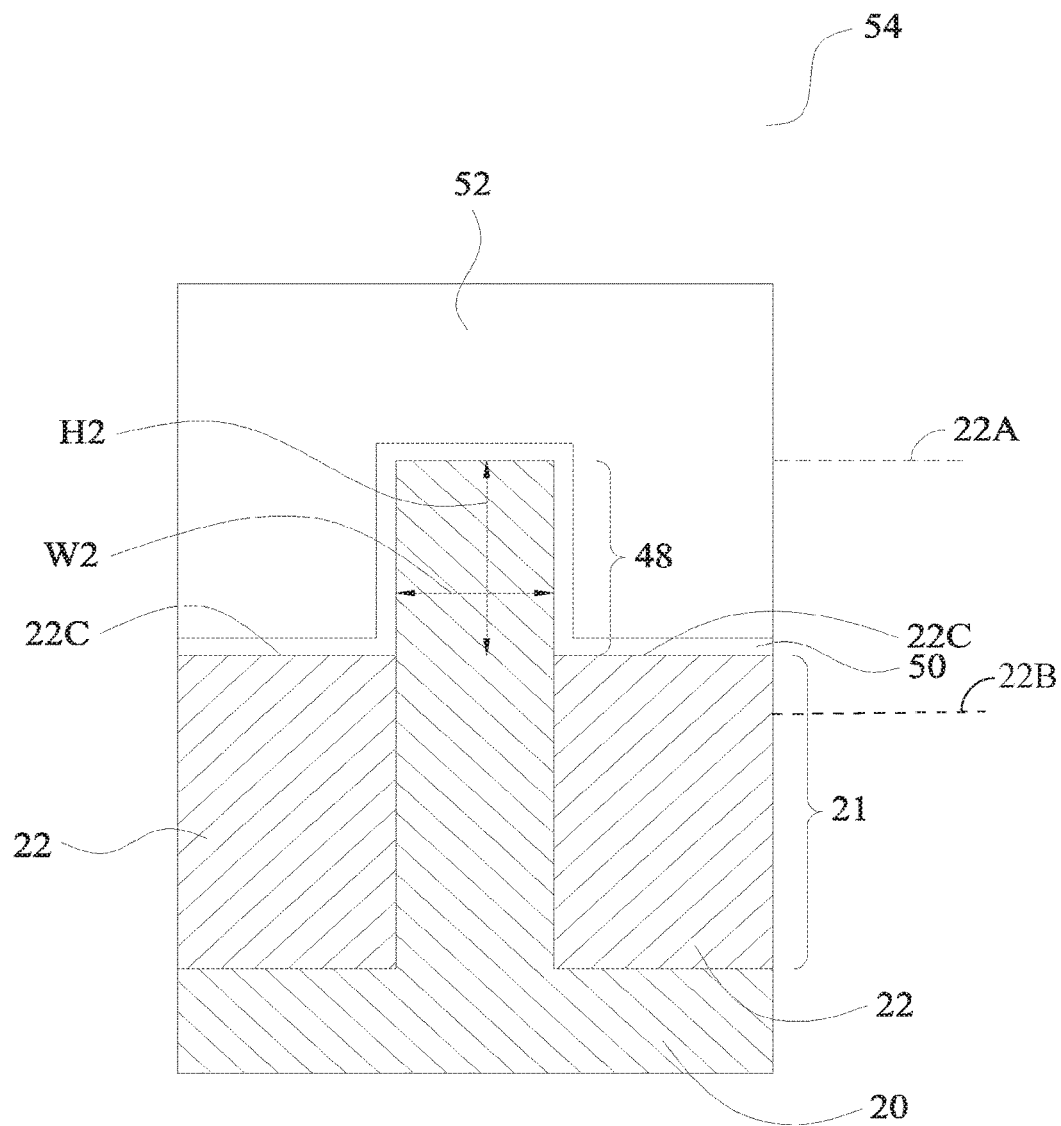

FIG. 21B illustrates the cross-sectional view of FinFET 54, wherein the cross-sectional view is obtained from the plane crossing line 21B-21B in FIG. 20A. As shown in FIG. 21B, the top surface 22C of STI regions 22 are illustrated. In addition, dashed lines illustrate the levels of STI top surfaces 22A and 22B, which are not in the illustrated plane. Width W2 (which may be equal to width W1 of source/drain regions 36) and height H2 of fin 48 are illustrated. In some embodiments, ratio W2/H2 is greater than about 1.0 and may be greater than about 5.0 or higher. In alternative embodiments, ratio W2/H2 is smaller than 1.0 and may be smaller than about, for example, 0.2.

Figure 21C:
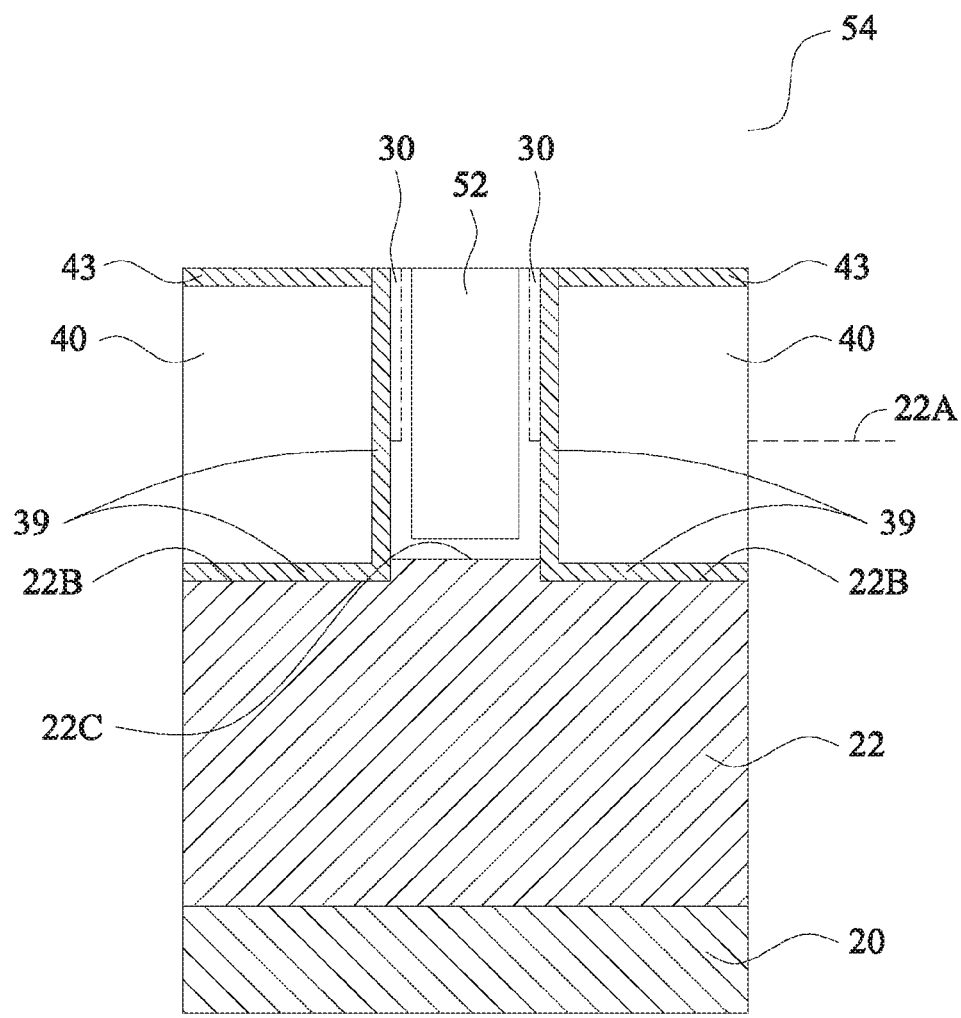
Figure 21D:
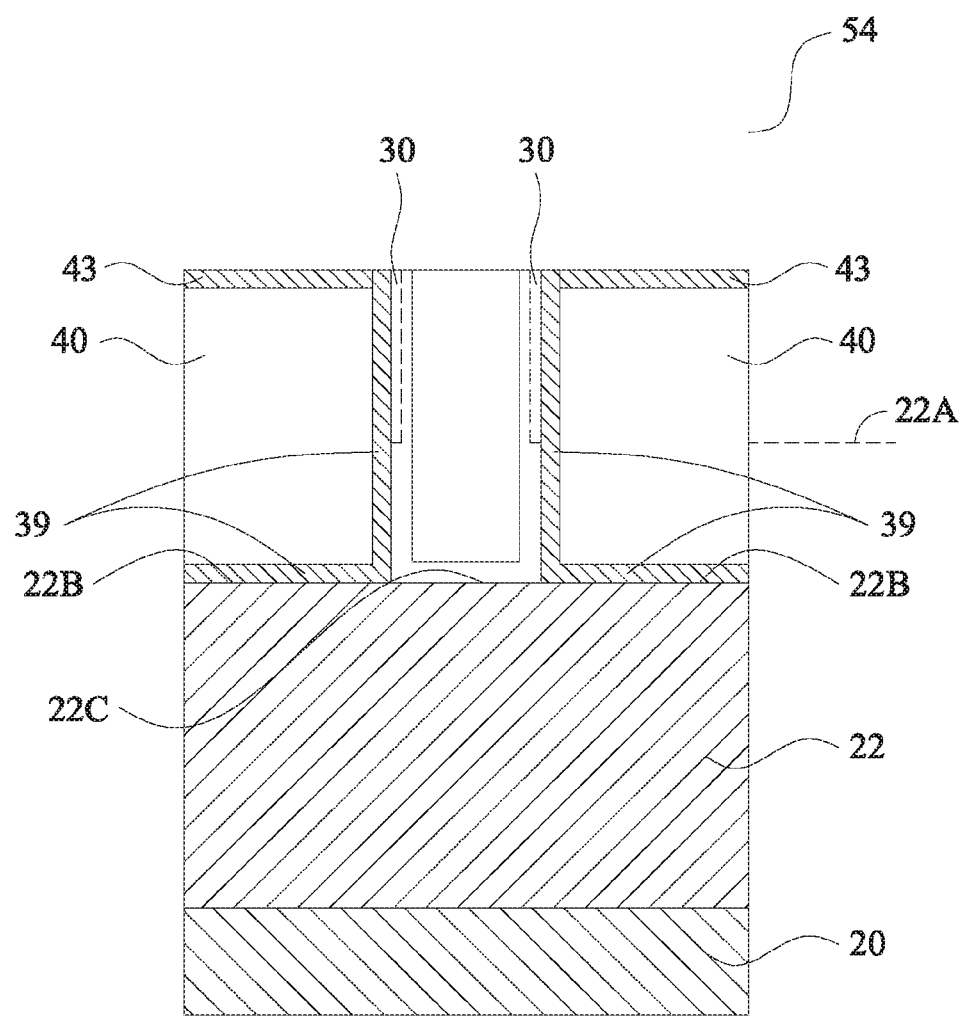

FIGS. 20C and 20D illustrate the cross-sectional view of FinFET 54, wherein the cross-sectional views are obtained from the same plane crossing line 20C/20D-20C/20D in FIG. 20A. The top surface 22B and 22C of STI regions 22 are illustrated. In addition, a dashed line is illustrated to show the level of STI top surfaces 22A, which is not in the illustrated plane. In some embodiments, as shown in FIG. 21C, top surface 22C of STI regions 22 is higher than top surfaces 22B of STI regions 22. In alternative embodiments, as shown in FIG. 21D, top surface 22C of STI regions 22 is substantially level with top surface 22B of STI regions 22.

The embodiments of the present disclosure have some advantageous features. By forming a dielectric mask layer on the sidewalls of a dummy gate and on the sidewalls of STI regions under the dummy gate, the dielectric mask layer extends below the bottom surface of the original semiconductor fin. Hence, the portions of STI regions on opposite sides of the semiconductor fin can be recessed to increased fin height. In the embodiments of the present disclosure, the increase in the fin height does not suffer from the undercut under gate spacers and hence will not cause electrical shorting of the replacement gate to the source/drain regions. In addition, forming a dielectric mask layer over ILD may prevent the dishing of ILD in the formation of replacement gate. This eliminates the possibility of the metallic material forming the metal gate being filled in the dished regions, which may cause electrical shorting of the metal gates to other features.

In accordance with some embodiments of the present disclosure, a method includes forming a gate stack over top surfaces of a semiconductor strip and insulation regions on opposite sides of the semiconductor strip. The insulation regions include first portions overlapped by the gate stack, and second portions misaligned from the gate stack. An end portion of the semiconductor strip is etched to form a recess, wherein the recess is located between the second portions of the insulation regions. An epitaxy is performed to grow a source/drain region from the recess. After the epitaxy, a recessing is performed to recess the second portions of the insulation regions, with the second portions of the insulation regions having first top surfaces after the first recessing. After the recessing, a dielectric mask layer is formed on the first top surfaces of the second portions of the insulation regions, wherein the dielectric mask layer further extends on a sidewall of the gate stack.

In accordance with alternative embodiments of the present disclosure, a method includes forming a gate stack on a top surface of a middle portion of a semiconductor strip, with the semiconductor strip between portions of insulation regions. The insulation regions include first portions overlapped by the gate stack, and second portions misaligned from the gate stack. A first recessing is performed to recess the second portions of the insulation regions, with the second portions of the insulation regions having top surfaces after the first recessing. The first portions of the insulation regions are not recessed in the first recessing. After the first recessing, A dielectric mask layer is formed on the top surfaces of the second portions of the insulation regions, wherein the dielectric mask layer further extends on a sidewall of the gate stack. After the dielectric mask layer is formed, the gate stack is removed. A second recessing is performed to recess the first portions of the insulation regions, wherein a top portion of the semiconductor strip is higher than top surfaces of remaining first portions of the insulation region to form a semiconductor fin. A replacement gate is formed in a space left by the gate stack.

In accordance with yet alternative embodiments of the present disclosure, an integrated circuit structure includes a semiconductor substrate, and insulation regions extending into the semiconductor substrate. The insulation regions include first portions comprising first top surfaces and second portions comprising second top surfaces. A semiconductor fin is over top surfaces of the insulation regions. A gate stack is on a top surface and sidewalls of the semiconductor fin, wherein the first portions of the insulation regions are overlapped by the gate stack, and the second portions of the insulation regions are misaligned from the gate stack. A source/drain region is on a side of the gate stack. The second portions of the insulation regions are on opposite sides of the source/drain region, and the source/drain region has a width and a height smaller than the width. A dielectric mask layer includes a vertical portion on a sidewall of the gate stack, wherein the vertical portion extends lower than a bottom of the semiconductor fin.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit structure comprising:
   a semiconductor substrate;
   an isolation region extending into the semiconductor substrate, wherein the isolation region comprises a first portion comprising a first top surface and a second portion comprising a second top surface;
   a semiconductor fin higher than the isolation region;
   a gate stack on the semiconductor fin and overlapping the first portion of the isolation region, wherein the semiconductor fin is directly under the gate stack, and wherein the second portion of the isolation region is misaligned from the gate stack;
   a source/drain region on a side of the gate stack and the semiconductor fin; and
   a dielectric mask layer comprising a vertical portion on a sidewall of the gate stack, wherein the vertical portion extends lower than a bottom of a portion of the semiconductor fin that is directly underlying and overlapped by the gate stack.

2. The integrated circuit structure of claim 1, wherein a sidewall of the dielectric mask layer further physically contacts a sidewall of the first portion of the isolation region to form a substantially vertical interface.

3. The integrated circuit structure of claim 1, wherein the substantially vertical sidewalls comprise:
   first portions higher than the second top surface of the second portion of the isolation region; and
   second portions lower than the second top surface of the second portion of the isolation region.

4. The integrated circuit structure of claim 1 further comprising a gate spacer on a sidewall of the gate stack, wherein the gate spacer comprises a portion directly over the isolation region, and a bottom surface of the portion of the gate spacer is vertically spaced apart from both the first top surface and the second top surface of the isolation region.

5. The integrated circuit structure of claim 1, wherein the first top surface of the isolation region is higher than the second top surface of the isolation region.

6. The integrated circuit structure of claim 1, wherein a bottommost surface of the dielectric mask layer is lower than a bottom surface of the gate stack.

7. A structure comprising:
   a bulk semiconductor substrate;
   a semiconductor fin;
   a gate stack on a top surface and a sidewall of the semiconductor fin;
   a gate spacer comprising an inner sidewall contacting the gate stack;
   an isolation region on a side of the semiconductor fin, wherein both the semiconductor fin and the isolation region are higher than the bulk semiconductor substrate;
   a dielectric mask layer comprising:
      a first horizontal portion overlapping the semiconductor fin;
      a second horizontal portion overlapping the isolation region; and
      a sidewall portion comprising a sidewall, and the sidewall comprises:
         an upper portion physically contacting an outer sidewall of the gate spacer; and
         a lower portion physically contacting the gate stack; and
   a source/drain region on a side of the gate stack and connected to the semiconductor fin.

8. The structure of claim 7, wherein a bottommost surface of the gate stack is higher than the second horizontal portion of the dielectric mask layer.

9. The structure of claim 7, wherein the gate spacer comprises a bottom surface comprising a portion contacting a top surface of a portion of a gate dielectric in the gate stack.

10. The structure of claim 7, wherein the second horizontal portion of the dielectric mask layer is in contact with a top surface of the isolation region.

11. The structure of claim 7, wherein the dielectric mask layer further comprises a first vertical portion directly contacting a sidewall of the isolation region.

12. The structure of claim 7, wherein the dielectric mask layer further comprises a second vertical portion contacting a sidewall of the source/drain region.

13. A structure comprising:
    a semiconductor fin;
    a gate stack on a top surface and a sidewall of the semiconductor fin;
    a gate spacer on a sidewall of the gate stack, wherein the gate spacer comprises:
       a first sidewall in direct contact with a sidewall of the gate stack; and
       a second sidewall opposite to the first sidewall; and
    a dielectric mask layer comprising a third sidewall, and the third sidewall comprises:
       an upper portion in physical contact with the second sidewall of the gate spacer; and
       a lower portion underlying the upper portion, wherein the lower portion is in physical contact with the gate stack to form an interface.

14. The structure of claim 13 further comprising an isolation region on a side of the semiconductor fin, wherein the sidewall of the dielectric mask layer further comprises a bottom portion in contact with a sidewall of the isolation region.

15. The structure of claim 14, wherein a bottom surface of the dielectric mask layer contacts a top surface of the isolation region, and the bottom surface of the dielectric mask layer is lower than the gate spacer.

16. The structure of claim 14, wherein the lower portion of the dielectric mask layer in contact with the gate stack overlaps the isolation region.

17. The structure of claim 13, wherein the gate spacer comprises a portion having a bottom surface directly over the interface.

18. The structure of claim 13, wherein a top surface of the dielectric mask layer is substantially coplanar with a top edge of the gate spacer.

19. The structure of claim 9, wherein the dielectric mask layer contacts the semiconductor fin.

20. The structure of claim 13, wherein the dielectric mask layer contacts the semiconductor fin.

* * * * *